United States Patent
Khlat

(10) Patent No.: US 9,912,297 B2
(45) Date of Patent: Mar. 6, 2018

(54) ENVELOPE TRACKING POWER CONVERTER CIRCUITRY

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 39 days.

(21) Appl. No.: 15/195,050

(22) Filed: Jun. 28, 2016

(65) Prior Publication Data

US 2017/0005619 A1  Jan. 5, 2017

Related U.S. Application Data

(63) Continuation-in-part of application No. 15/142,725, filed on Apr. 29, 2016.

(60) Provisional application No. 62/209,950, filed on Aug. 26, 2015, provisional application No. 62/187,355, filed on Jul. 1, 2015, provisional application No. 62/190,088, filed on Jul. 8, 2015, provisional application No. 62/273,670, filed on Dec. 31, 2015.

(51) Int. Cl.
| | |
|---|---|
| H03F 1/02 | (2006.01) |
| H03F 3/19 | (2006.01) |
| H03F 3/24 | (2006.01) |
| H03F 3/68 | (2006.01) |
| H04B 1/04 | (2006.01) |

(52) U.S. Cl.
CPC ............ *H03F 1/0227* (2013.01); *H03F 3/19* (2013.01); *H03F 3/245* (2013.01); *H03F 3/68* (2013.01); *H04B 1/04* (2013.01); *H03F 2200/102* (2013.01); *H03F 2200/105* (2013.01); *H03F 2200/111* (2013.01); *H03F 2200/451* (2013.01)

(58) Field of Classification Search
CPC ................................. H03F 1/0288; H03F 1/30
USPC ....................................... 330/295, 297, 124 R
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |

(Continued)

FOREIGN PATENT DOCUMENTS

| | | |
|---|---|---|
| CN | 1076567 A | 9/1993 |
| CN | 1211355 A | 3/1999 |

(Continued)

OTHER PUBLICATIONS

Non-Final Office Action for U.S. Appl. No. 13/714,600, mailed Feb. 16, 2017, 14 pages.

(Continued)

*Primary Examiner* — Henry Choe
(74) *Attorney, Agent, or Firm* — Withrow & Terranova, P.L.L.C.

(57) ABSTRACT

Envelope tracking power converter circuitry is configured to receive a supply voltage and simultaneously provide two envelope tracking power supply signals, an envelope tracking power supply signal and an average power tracking power supply signal, or a single envelope tracking power supply signal with improved efficiency. When providing a single envelope tracking power supply signal, an envelope tracking power supply signal is provided to a parallel amplifier in the envelope tracking power converter circuitry to provide multiple levels of envelope tracking which improves efficiency.

20 Claims, 11 Drawing Sheets

(56) References Cited

U.S. PATENT DOCUMENTS

| | | |
|---|---|---|
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,426,680 B1 | 7/2002 | Duncan et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,725,021 B1 | 4/2004 | Anderson et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,026,868 B2 | 4/2006 | Robinson et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,064,606 B2 | 6/2006 | Louis |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,391,190 B1 | 6/2008 | Rajagopalan |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,453,711 B2 | 11/2008 | Yanagida et al. |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,777,470 B2 | 8/2010 | Lindeberg et al. |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,863,828 B2 | 1/2011 | Melanson |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,917,105 B2 | 3/2011 | Drogi et al. |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,093,953 B2 | 1/2012 | Pierdomenico et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |
| 8,364,101 B2 | 1/2013 | Shizawa et al. |
| 8,446,135 B2 | 5/2013 | Chen et al. |
| 8,493,141 B2 | 7/2013 | Khlat et al. |

(56) References Cited

U.S. PATENT DOCUMENTS

| | | |
|---|---|---|
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,643,435 B2 * | 2/2014 | Lim .............. H03F 1/0227 330/127 |
| 8,648,657 B1 | 2/2014 | Rozenblit |
| 8,659,355 B2 | 2/2014 | Henshaw et al. |
| 8,692,527 B2 | 4/2014 | Ritamaki et al. |
| 8,693,676 B2 | 4/2014 | Xiao et al. |
| 8,698,558 B2 | 4/2014 | Mathe et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,754,707 B2 | 6/2014 | Mathe et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,088,247 B2 | 7/2015 | Amo et al. |
| 9,099,961 B2 | 8/2015 | Kay et al. |
| 9,112,452 B1 | 8/2015 | Khlat |
| 9,445,371 B2 | 9/2016 | Khesbak et al. |
| 9,491,314 B2 * | 11/2016 | Wimpenny .............. H02M 3/07 |
| 9,515,622 B2 | 12/2016 | Nentwig et al. |
| 9,628,025 B2 * | 4/2017 | Wimpenny ............ H03F 1/0222 |
| 2002/0071497 A1 | 6/2002 | Bengtsson et al. |
| 2002/0125869 A1 | 9/2002 | Groom et al. |
| 2002/0176188 A1 | 11/2002 | Ruegg et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0258891 A1 | 11/2005 | Ito et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0087372 A1 | 4/2006 | Henze |
| 2006/0097711 A1 | 5/2006 | Brandt |
| 2006/0114069 A1 | 6/2006 | Kojima et al. |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008757 A1 | 1/2007 | Usui et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0150620 A1 | 6/2008 | Lesso |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0015299 A1 | 1/2009 | Ryu et al. |
| 2009/0039947 A1 | 2/2009 | Williams |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |

(56) References Cited

U.S. PATENT DOCUMENTS

| | | |
|---|---|---|
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2009/0326624 A1 | 12/2009 | Melse |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagi |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0148385 A1 | 6/2011 | North et al. |
| 2011/0193629 A1 | 8/2011 | Hou et al. |
| 2011/0204959 A1 | 8/2011 | Sousa et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049818 A1 | 3/2012 | Hester |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0139641 A1 | 6/2012 | Kaczman et al. |
| 2012/0146731 A1 | 6/2012 | Khesbak |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0249103 A1 | 10/2012 | Latham, II et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0127548 A1 | 5/2013 | Popplewell et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0176076 A1 | 7/2013 | Riehl |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0231069 A1 | 9/2013 | Drogi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184334 A1 | 7/2014 | Nobbe et al. |
| 2014/0184335 A1 | 7/2014 | Nobbe et al. |
| 2014/0184337 A1 | 7/2014 | Nobbe et al. |
| 2014/0203868 A1 | 7/2014 | Khlat et al. |
| 2014/0203869 A1 | 7/2014 | Khlat et al. |
| 2014/0218109 A1* | 8/2014 | Wimpenny ............ H03F 3/217 330/251 |
| 2014/0225674 A1 | 8/2014 | Folkmann et al. |
| 2014/0232458 A1 | 8/2014 | Arno et al. |
| 2014/0266427 A1 | 9/2014 | Chiron |
| 2014/0266428 A1 | 9/2014 | Chiron et al. |
| 2014/0266462 A1 | 9/2014 | Schirmann et al. |
| 2014/0285164 A1 | 9/2014 | Oishi et al. |
| 2014/0306769 A1 | 10/2014 | Khlat et al. |
| 2015/0048024 A1 | 2/2015 | Rozek et al. |
| 2015/0054588 A1* | 2/2015 | Wimpenny ........... H03F 1/0227 330/297 |
| 2015/0097624 A1 | 4/2015 | Olson et al. |
| 2015/0123733 A1* | 5/2015 | Wimpenny ........... H03F 1/0227 330/279 |
| 2015/0180422 A1 | 6/2015 | Khlat et al. |
| 2015/0234402 A1 | 8/2015 | Kay et al. |
| 2015/0270806 A1 | 9/2015 | Wagh et al. |
| 2015/0333781 A1 | 11/2015 | Alon et al. |
| 2016/0380597 A1 | 12/2016 | Midya |

FOREIGN PATENT DOCUMENTS

| | | |
|---|---|---|
| CN | 1443395 A | 9/2003 |
| CN | 1518209 A | 8/2004 |
| CN | 1592089 A | 3/2005 |
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |

(56) References Cited

FOREIGN PATENT DOCUMENTS

| | | |
|---|---|---|
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| CN | 102403967 A | 4/2012 |
| EP | 0755121 A2 | 1/1997 |
| EP | 1047188 A2 | 10/2000 |
| EP | 1317105 A1 | 6/2003 |
| EP | 1383235 A1 | 1/2004 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Notice of Allowance for U.S. Appl. No. 14/163,256, mailed Feb. 21, 2017, 7 pages.
Non-Final Office Action for U.S. Appl. No. 15/142,634, mailed Jan. 20, 2017, 6 pages.
Final Office Action for U.S. Appl. No. 13/876,518, mailed Mar. 9, 2017, 18 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm 2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.
Extended European Search Report for application 06740532.4, mailed Dec. 7, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.

(56) References Cited

OTHER PUBLICATIONS

Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Non-Final Office Action for U.S. Appl. No. 12/836,307, mailed Sep. 25, 2014, 5 pages.

(56) References Cited

OTHER PUBLICATIONS

Notice of Allowance for U.S. Appl. No. 12/836,307, mailed Mar. 2, 2015, 6 pages.
Notice of Allowance for U.S. Appl. No. 13/948,291, mailed Feb. 11, 2015, 7 pages.
First Office Action for Chinese Patent Application No. 201180030273.5, issued Dec. 3, 2014, 15 pages (with English translation).
European Examination Report for European Patent Application No. 14162682.0, mailed May 22, 2015, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/297,470, mailed Feb. 25, 2015, 15 pages.
corrected Notice of Allowance for U.S. Appl. No. 13/297,470, mailed Apr. 6, 2015, 11 pages.
Notice of Allowance for U.S. Appl. No. 14/022,858, mailed Feb. 17, 2015, 7 pages.
Notice of Allowance for U.S. Appl. No. 13/367,973, mailed Sep. 15, 2014, 7 pages.
Notice of Allowance for U.S. Appl. No. 14/072,140, mailed Dec. 2, 2014, 8 pages.
Extended European Search Report for European Patent Application No. 14190851.7, issued Mar. 5, 2015, 6 pages.
Notice of Allowance for U.S. Appl. No. 14/072,225, mailed Jan. 22, 2015, 7 pages.
Non-Final Office Action for U.S. Appl. No. 14/122,852, mailed Feb. 27, 2015, 5 pages.
First Office Action for Chinese Patent Application No. 201280026559.0, issued Nov. 3, 2014, 14 pages (with English translation).
Extended European Search Report for European Patent Application No. 12794149.0, issued Oct. 29, 2014, 6 pages.
Notice of Allowance for U.S. Appl. No. 13/486,012, mailed Nov. 21, 2014, 8 pages.
Notice of Allowance for U.S. Appl. No. 13/647,815, mailed Sep. 19, 2014, 6 pages.
Final Office Action for U.S. Appl. No. 13/689,883, mailed Jan. 2, 2015, 13 pages.
Advisory Action for U.S. Appl. No. 13/689,883, mailed Apr. 20, 2015, 3 pages.
Non-Final Office Action for U.S. Appl. No. 13/661,227, mailed Sep. 29, 2014, 24 pages.
Final Office Action for U.S. Appl. No. 13/661,227, mailed Feb. 6, 2015, 24 pages.
Advisory Action for U.S. Appl. No. 13/661,227, mailed May 12, 2015, 3 pages.
Notice of Allowance for U.S. Appl. No. 13/690,187, mailed Dec. 19, 2014, 8 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Final Office Action for U.S. Appl. No. 13/714,600, mailed Mar. 10, 2015, 14 pages.
Advisory Action for U.S. Appl. No. 13/714,600, mailed May 26, 2015, 3 pages.
Notice of Allowance for U.S. Appl. No. 13/747,694, mailed Dec. 22, 2014, 9 pages.
Notice of Allowance for U.S. Appl. No. 13/914,888, mailed Oct. 17, 2014, 10 pages.
Notice of Allowance for U.S. Appl. No. 13/951,976, mailed Dec. 26, 2014, 9 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Non-Final Office Action for U.S. Appl. No. 14/056,292, mailed Mar. 6, 2015, 8 pages.
Non-Final Office Action for U.S. Appl. No. 13/747,725, mailed Oct. 7, 2014, 6 pages.
Notice of Allowance for U.S. Appl. No. 13/747,725, mailed Feb. 2, 2015, 10 pages.
Notice of Allowance for U.S. Appl. No. 13/747,725, mailed May 13, 2015, 9 pages.
Non-Final Office Action for U.S. Appl. No. 13/747,749, mailed Nov. 12, 2014, 32 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Non-Final Office Action for U.S. Appl. No. 13/689,940, mailed May 14, 2015, 7 pages.
International Search Report and Written Opinion for PCT/US2014/012927, mailed Sep. 30, 2014, 11 pages.
Advisory Action for U.S. Appl. No. 13/714,600, mailed Dec. 16, 2016, 3 pages.
Notice of Allowance for U.S. Appl. No. 14/789,464, mailed Oct. 26, 2016, 7 pages.
Notice of Allowance and Examiner Initiated Interview Summary for U.S. Appl. No. 14/082,629, mailed Dec. 7, 2016, 11 pages.
First Office Action for Chinese Patent Application No. 201380039592.1, mailed Oct. 31, 2016, 13 pages.
Invitation Pursuant to Rule 137(4) EPC and Article 94(3) EPC for European Patent Application No. 12725911.7, mailed Jan. 2, 2017, 2 pages.
Notice of Allowance for U.S. Appl. No. 14/638,374, mailed Aug. 30, 2016, 7 pages.
Final Office Action for U.S. Appl. No. 13/714,600, mailed Oct. 5, 2016, 15 pages.
Final Office Action for U.S. Appl. No. 14/082,629, mailed Sep. 8, 2016, 13 pages.
Non-Final Office Action and Examiner Initiated Interview Summary for U.S. Appl. No. 13/876,518, mailed Sep. 22, 2016, 18 pages.
Author Unknown, "Automatically," Definition, Dictionary.com Unabridged, 2015, pp. 1-6, http://dictionary.reference.com/browse/automatically.
Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.
Second Office Action for Chinese Patent Application No. 201180030273.5, issued Aug. 14, 2015, 8 pages.
Examination Report for European Patent Application No. 14190851.7, mailed May 2, 2016, 5 pages.
Notice of Allowance for U.S. Appl. No. 14/072,225, mailed Feb. 3, 2016, 7 pages.
Final Office Action for U.S. Appl. No. 13/689,883, mailed Dec. 23, 2015, 12 pages.
Advisory Action for U.S. Appl. No. 13/689,883, mailed Mar. 4, 2016, 3 pages.
Non-Final Office Action for U.S. Appl. No. 13/689,883, mailed Apr. 20, 2016, 13 pages.
First Office Action for Chinese Patent Application No. 201280042523.1, issued Dec. 4, 2015, 12 pages.

(56) References Cited

OTHER PUBLICATIONS

First Office Action for Chinese Patent Application No. 201280052739.6, mailed Mar. 3, 2016, 31 pages.
Final Office Action for U.S. Appl. No. 13/661,227, mailed Feb. 9, 2016, 28 pages.
Notice of Allowance and Examiner Initiated Interview Summary for U.S. Appl. No. 13/661,227, mailed May 13, 2016, 10 pages.
Final Office Action for U.S. Appl. No. 13/714,600, mailed Dec. 24, 2015, 15 pages.
Advisory Action for U.S. Appl. No. 13/714,600, mailed Mar. 14, 2016, 3 pages.
Non-Final Office Action for U.S. Appl. No. 13/714,600, mailed May 4, 2016, 14 pages.
Notice of Allowance for U.S. Appl. No. 13/747,725, mailed Oct. 28, 2015, 9 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Advisory Action for U.S. Appl. No. 13/689,922, mailed Dec. 18, 2015, 3 pages.
Notice of Allowance for U.S. Appl. No. 13/689,922, mailed Mar. 18, 2016, 9 pages.
Notice of Allowance for U.S. Appl. No. 13/727,911, mailed Sep. 14, 2015, 8 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
Notice of Allowance for U.S. Appl. No. 14/163,256, mailed Feb. 10, 2016, 8 pages.
Notice of Allowance for U.S. Appl. No. 13/689,940, mailed Sep. 16, 2015, 7 pages.
Corrected Notice of Allowability for U.S. Appl. No. 13/689,940, mailed Nov. 17, 2015, 4 pages.
Non-Final Office Action for U.S. Appl. No. 14/101,770, mailed Sep. 21, 2015, 5 pages.
Notice of Allowance for U.S. Appl. No. 14/101,770, mailed Apr. 11, 2016, 6 pages.
Notice of Allowance for U.S. Appl. No. 14/151,167, mailed Mar. 4, 2016, 7 pages.
Notice of Allowance for U.S. Appl. No. 13/661,164, mailed Oct. 21, 2015, 7 pages.
Final Office Action for U.S. Appl. No. 14/082,629, mailed Nov. 4, 2015, 17 pages.
Advisory Action for U.S. Appl. No. 14/082,629, mailed Jan. 22, 2016, 3 pages.
Non-Final Office Action for U.S. Appl. No. 14/082,629, mailed Mar. 16, 2016, 23 pages.
Non-Final Office Action for U.S. Appl. No. 14/702,192, mailed Oct. 7, 2015, 7 pages.
Notice of Allowance for U.S. Appl. No. 14/702,192, mailed Feb. 22, 2016, 8 pages.
Non-Final Office Action for U.S. Appl. No. 14/254,215, mailed Oct. 15, 2015, 5 pages.
Notice of Allowance for U.S. Appl. No. 14/254,215, mailed Feb. 18, 2016, 7 pages.
Non-Final Office Action for U.S. Appl. No. 14/458,341, mailed Nov. 12, 2015, 5 pages.
Notice of Allowance for U.S. Appl. No. 14/458,341, mailed Feb. 18, 2016, 6 pages.
Non-Final Office Action for U.S. Appl. No. 13/876,518, mailed Jan. 20, 2016, 16 pages.
Final Office Action for U.S. Appl. No. 13/876,518, mailed Jun. 2, 2016, 14 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.
Communication under Rule 164(2)(a) EPC for European Patent Application No. 12725911.7, mailed Feb. 17, 2016, 8 pages.
Combined Search and Examination Report for European Patent Application No. 12725911.7, mailed Jun. 15, 2016, 14 pages.
Notice of Allowance for U.S. Appl. No. 13/689,883, mailed Jul. 27, 2016, 9 pages.
Advisory Action for U.S. Appl. No. 13/876,518, mailed Aug. 15, 2016, 3 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
International Search Report and Written Opinion for PCT/US2014/028178, mailed Sep. 30, 2014, 17 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, mailed Jul. 17, 2015, 8 pages.
Corrected Notice of Allowance for U.S. Appl. No. 13/297,470, mailed Jun. 5, 2015, 11 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.

(56) References Cited

OTHER PUBLICATIONS

Notice of Allowance for U.S. Appl. No. 14/212,199, mailed Jul. 20, 2015, 8 pages.
Notice of Allowance for U.S. Appl. No. 13/747,725, mailed Sep. 1, 2015, 9 pages.
Notice of Allowance for U.S. Appl. No. 13/747,749, mailed Jun. 4, 2015, 8 pages.
Notice of Allowance for U.S. Appl. No. 14/072,120, mailed Jul. 30, 2015, 7 pages.
Notice of Allowance for U.S. Appl. No. 14/027,416, mailed Aug. 11, 2015, 9 pages.
Notice of Allowance for U.S. Appl. No. 13/689,940, mailed Aug. 3, 2015, 6 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
First Office Action and Search Report for Chinese Patent Application No. 201280007941.7, issued May 13, 2015, 13 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Communication Pursuant to Article 94(3) EPC for European Patent Application No. 12725911.7, dated May 24, 2017, 6 pages.
Partial European Search Report for European Patent Application No. 16204437.4, dated Apr. 12, 2017, 9 pages.
Notice of Allowance for U.S. Appl. No. 13/714,600, dated Jun. 29, 2017, 8 pages.
Advisory Action for U.S. Appl. No. 13/876,518, dated May 17, 2017, 3 pages.
Examination Report for European Patent Application No. 14162658.0, dated Jun. 29, 2017, 4 pages.
Non-Final Office Action for U.S. Appl. No. 15/142,725, dated Jul. 21, 2017, 7 pages.
Non-Final Office Action for U.S. Appl. No. 15/142,859, dated Aug. 11, 2017, 7 pages.
Non-Final Office Action for U.S. Appl. No. 13/876,518, dated Aug. 10, 2017, 19 pages.
Notice of Allowance for U.S. Appl. No. 14/163,256, dated Dec. 21, 2017, 7 pages.
Notice of Allowance for U.S. Appl. No. 15/142,725, dated Nov. 22, 2017, 7 pages.
Notice of Allowance for U.S. Appl. No. 15/142,859, dated Dec. 7, 2017, 7 pages.
Notice of Allowance for U.S. Appl. No. 15/479,832, dated Jan. 10, 2018, 9 pages.
Notice of Allowance for U.S. Appl. No. 13/876,518, dated Dec. 6, 2017, 7 pages.

* cited by examiner

ENVELOPE TRACKING POWER CONVERTER CIRCUITRY

RELATED APPLICATIONS

This application claims the benefit of U.S. provisional patent application No. 62/209,950, filed Aug. 26, 2015, and is a continuation-in-part of U.S. patent application Ser. No. 15/142,725 which claims the benefit of U.S. provisional patent application No. 62/187,355, filed Jul. 1, 2015, U.S. provisional patent application No. 62/190,088, filed Jul. 8, 2015, and U.S. provisional patent application No. 62/273,670, filed Dec. 31, 2015, the disclosures of which are incorporated herein by reference in their entirety.

FIELD OF THE DISCLOSURE

The present disclosure relates to circuitry for facilitating envelope tracking power supplies, and specifically to power converter circuitry for envelope tracking.

BACKGROUND

Many modern electronic devices include wireless communications circuitry. For example, an electronic device may include wireless local area network (WLAN) communications circuitry, cellular communications circuitry, or the like. While wireless communications circuitry allows electronic devices to communicate with one another, such functionality generally comes at the cost of additional energy consumption and thus reduced battery life. Often, wireless communications circuitry is the largest consumer of energy in an electronics device. As wireless communications protocols evolve to provide higher speeds, energy consumption of communications circuitry often increases to meet the higher demands of such protocols.

Consumer demand for longer battery life from electronic devices has resulted in the development of many power-saving techniques for wireless communications. One way to conserve power consumed via wireless communications is through the use of envelope tracking. Envelope tracking involves modulating a supply voltage provided to an amplifier based on the instantaneous magnitude (i.e., the envelope) of an RF input signal provided to the amplifier. FIG. 1 illustrates the basic concept of envelope tracking. Specifically, FIG. 1 shows an amplitude-modulated RF signal 10. Conventionally, a constant supply voltage at a level sufficient to ensure adequate headroom across the entire amplitude range of the RF signal 10 would be supplied to the amplifier, as shown by line 12. This results in a significant amount of wasted energy, and thus poor efficiency, when the amplitude of the RF signal 10 is below the maximum level, as illustrated by line 14. Accordingly, an envelope power supply signal tracks the amplitude of the RF signal 10, as illustrated by line 16, and therefore increases efficiency by preventing the unnecessary expenditure of power when the amplitude of the RF signal 10 is below the maximum level.

To employ envelope tracking as described above, electronic devices typically include envelope tracking power converter circuitry configured to generate the envelope tracking power supply signal illustrated by line 16. A functional block diagram illustrating a typical configuration for an RF transmitter section 18 including envelope tracking power converter circuitry 20 is shown in FIG. 2. The RF transmitter section 18 includes the envelope tracking power converter circuitry 20, a power amplifier 22, RF front end circuitry 24, and an antenna 26. The envelope tracking power converter circuitry 20 receives a supply voltage V_SUPP and an envelope control signal ECS and provides an envelope power supply signal EPS from the supply voltage V_SUPP and the envelope control signal ECS. The power amplifier 22 uses the envelope power supply signal EPS to amplify an RF input signal RF_IN and provide an RF output signal RF_OUT. The RF front end circuitry 24 receives the RF output signal RF_OUT and performs any necessary filtering or routing of the signal, ultimately delivering the RF output signal RF_OUT to the antenna 26. As discussed above, using the envelope power supply signal EPS to amplify the RF input signal RF_IN and provide the RF output signal RF_OUT results in a significant increase in the efficiency of the RF transmitter section 18.

The envelope control signal ECS may be generated in any number of different ways, the details of which will be appreciated by those of ordinary skill in the art. For example, envelope tracking circuitry may receive a baseband input signal, the RF input signal RF_IN, the RF output signal RF_OUT, and/or may be in communication with a modulator in order to detect an envelope of the signal. The envelope tracking circuitry may then communicate with a look-up table that provides the envelope control signal ECS based on the detected envelope. In some cases, such a look-up table may provide the envelope control signal ECS according to an isogain contour of the power amplifier 22 in order to compensate for changes in linearity of the power amplifier 22 as the envelope power supply signal EPS changes.

FIG. 3 is a functional block diagram illustrating details of the envelope tracking power converter circuitry 20. The envelope tracking power converter circuitry 20 includes main power converter switching circuitry 28 configured to receive the supply voltage V_SUPP and provide a main converted power supply signal MCPS from a holding inductor L_HLD to a smoothing capacitor C_SMTH. In particular, the main converted power supply signal MCPS is provided based on a main power converter control signal MPCC provided from main power converter control circuitry 30. A number of main power converter flying capacitors C_FLYM and the holding inductor L_HLD are charged and discharged by the main power converter switching circuitry 28 to provide the main converter power supply signal MCPS. The holding inductor L_HLD stores and supplies power as required to provide the majority of the envelope power supply signal EPS. The smoothing capacitor C_SMTH reduces ripple that may be present in the envelope power supply signal EPS. The main power converter switching circuitry 28 generally forms a buck/boost converter with the main power converter flying capacitors C_FLYM and the holding inductor L_HLD, the details of which will be readily appreciated by those of ordinary skill in the art. The main power converter control signal MPCC may thus include a plurality of control signals each configured to control a different switching element in the main power converter switching circuitry 28 in order to deliver a desired voltage and/or current to the main power converter flying capacitors C_FLYM and the holding inductor L_HLD.

Parallel amplifier power converter switching circuitry 32 also receives the supply voltage V_SUPP and provides a parallel amplifier supply voltage PA_SUPP to a parallel amplifier 34. In particular, the parallel amplifier power converter switching circuitry 32 charges and discharges a parallel amplifier power converter capacitor C_PA and a parallel amplifier power converter inductor L_PA to provide the parallel amplifier power supply voltage PA_SUPP. The parallel amplifier supply voltage PA_SUPP is provided based on a parallel amplifier power converter control signal PAPCC, which is provided by parallel amplifier power converter control circuitry 36. The parallel amplifier power converter switching circuitry 32 may form a buck/boost converter with the parallel amplifier power converter capacitor C_PA and the parallel amplifier power converter inductor L_PA, similar to the main power converter switching circuitry 28 discussed above. However, the power demand of the parallel amplifier 34 is significantly less than that of a power amplifier for which the envelope power supply signal EPS is generated. Accordingly, the switching components within the parallel amplifier power converter switching circuitry 32 will be significantly smaller than those in the main power converter switching circuitry 28. Further, the parallel amplifier power converter capacitor C_PA and the parallel amplifier power converter inductor L_PA are generally significantly smaller than the main power converter flying capacitors C_FLYM and the holding inductor L_HLD, respectively.

Signal conditioning circuitry 38 receives the envelope control signal(s) ECS, which may be a differential signal. These envelope control signal(s) ECS, which indicate a target value of the envelope power supply signal EPS, are conditioned and forwarded to the parallel amplifier 34 as conditioned envelope control signal(s) ECS_C. Further, the envelope control signal(s) or one or more derivatives thereof are provided to the parallel amplifier power converter control circuitry 36, where they are used to provide to the parallel amplifier power converter control signal PAPCC. In particular, the parallel amplifier power converter control signal PAPCC is used to provide a minimum parallel amplifier supply voltage PA_SUPP necessary for the parallel amplifier 34 to operate and control the envelope power supply signal EPS as discussed below.

In addition to the parallel amplifier supply voltage PA_SUPP and the conditioned envelope control signal(s) ECS_C, the parallel amplifier 34 also receives a feedback signal FB via a voltage divider formed from a first feedback resistor R_FB1 and a second feedback resistor R_FB2. Using these signals, the parallel amplifier 34 provides an output voltage V_OUT and an output current I_OUT. Specifically, the parallel amplifier 34 acts similar to an operational amplifier, and attempts to equalize the voltage on an inverted terminal and a non-inverted terminal by changing the output voltage V_OUT and the output current I_OUT thereof. The output voltage V_OUT is delivered to an offset capacitor C_OFF, which is coupled between the holding inductor L_HLD and the smoothing capacitor C_SMTH. In general, the output voltage V_OUT contributes minimally to the envelope power supply signal EPS, acting only as a control for the main power converter switching circuitry 28. However, in some situations where the main power converter switching circuitry 28 along with the main power converter flying capacitors C_FLYM and the holding inductor L_HLD are incapable of providing or maintaining a particular envelope power supply signal EPS (e.g., due to very high bandwidth of the envelope power supply signal EPS and the fact that the rate of change of the current provided by the holding inductor L_HLD is limited), the output voltage V_OUT may contribute to the envelope power supply signal EPS for short periods of time. The offset capacitor C_OFF, in addition to storing charge that may be required to boost the envelope power supply signal EPS in times of rapid change or large signal amplitudes as discussed above, also reduces the necessary dynamic range of the output voltage V_OUT from the parallel amplifier 34 to maintain full control over the envelope power supply signal EPS. This in turn reduces the necessary parallel amplifier supply voltage PA_SUPP and thus improves efficiency. The output current I_OUT is provided to the main power converter control circuitry 30, and is used to generate the main power converter control signal MPCC. Accordingly, the parallel amplifier 34 acts primarily as a master device, with the main power converter switching circuitry 28 as a slave device via the output current I_OUT from the parallel amplifier 34. This design choice is due to the fact that the parallel amplifier 34 is a linear amplifier that is not very efficient at providing signals with the dynamic range of the envelope power supply signal EPS, while the main power converter switching circuitry 28 is very efficient at doing so. Operating the main power converter switching circuitry 28 and the parallel amplifier 34 in this manner thus allows for accurate envelope tracking with good efficiency.

Bandwidth aggregation techniques such as carrier aggregation and multiple-input-multiple-output (MIMO) have become commonplace in wireless communications devices. Downlink carrier aggregation occurs when multiple RF signals are simultaneously received by a mobile communications device. Uplink carrier aggregation occurs when multiple RF signals are simultaneously transmitted from a wireless communications device. An exemplary RF transmitter section 40 capable of uplink carrier aggregation is shown in FIG. 4. The RF transmitter section 40 includes first envelope tracking power converter circuitry 42, a first power amplifier 44, second envelope tracking power converter circuitry 46, a second power amplifier 48, RF front end circuitry 50, a first antenna 52A, and a second antenna 52B. The first envelope tracking power converter circuitry 42 receives the supply voltage V_SUPP and a first envelope control signal ECS1 and provides a first envelope power supply signal EPS1 to the first power amplifier 44. The second envelope tracking power converter circuitry 46 receives the supply voltage V_SUPP and a second envelope control signal ECS2 and provides a second envelope power supply signal EPS2 to the second power amplifier 48. The first power amplifier 44 uses the first envelope power supply signal EPS1 to amplify a first RF input signal RF_IN1 and provide a first RF output signal RF_OUT1. The second power amplifier 48 uses the second envelope power supply signal EPS2 to amplify a second RF input signal RF_IN2 and provide a second RF output signal RF_OUT2. The RF front end circuitry 50 performs filtering and routing on the first RF output signal RF_OUT1 and the second RF output signal RF_OUT2, providing each of these signals to a different one of the antennas 52. Accordingly, the RF transmitter section 40 may perform uplink carrier aggregation.

While the RF transmitter section 40 is capable of performing uplink carrier aggregation with envelope tracking for multiple power amplifiers, such functionality comes at the cost of significantly increased area of the RF transmitter section 40. Each one of the first envelope tracking power converter circuitry 42 and the second envelope tracking power converter circuitry 46 may be quite large due to the various inductive elements, capacitive elements, and switching elements contained therein (particularly in the main power converter switching circuitry 28 and the parallel amplifier power converter switching circuitry 32 discussed above). Providing envelope tracking power converter circuitry for each uplink carrier aggregation transmitter may therefore not be suitable for mobile communications devices in which space is highly limited. Accordingly, there is a need for improved envelope power converter circuitry that is small in size and capable of supporting uplink carrier aggregation.

SUMMARY

The present disclosure relates to circuitry for facilitating envelope tracking power supplies, and specifically to power converter circuitry for envelope tracking. In one embodiment, envelope tracking power converter circuitry includes a first envelope tracking power supply signal output node, a second envelope tracking power supply signal output node, a main switching power converter, a voltage regulator, a first parallel amplifier, a second parallel amplifier, a first auxiliary switching power converter, and a second auxiliary switching power converter. The main switching power converter provides a boost voltage based on a supply voltage. The voltage regulator provides a regulated supply voltage based on the supply voltage. The first parallel amplifier provides a first output voltage and a first output current based on a first parallel amplifier supply voltage, a first envelope power converter control signal, and a first feedback signal from the first envelope tracking power supply signal output node. The second parallel amplifier provides a second output voltage and a second output current based on a second parallel amplifier supply voltage, a second envelope power converter control signal, and a second feedback signal from the second envelope tracking power supply signal output node.

In a first mode of operation of the first auxiliary switching power converter, the first auxiliary switching power converter provides a portion of a first envelope tracking power supply signal to the first envelope tracking power supply signal output node based on the boost voltage and a first auxiliary control signal, which is based on the first output current from the first parallel amplifier. In a second mode of operation of the first auxiliary switching power converter, the first auxiliary switching power converter provides the second parallel amplifier supply voltage to the second parallel amplifier based on the boost voltage such that the second parallel amplifier supply voltage is envelope modulated. In a first mode of operation of the second auxiliary switching power converter, the second auxiliary switching power converter provides a portion of a second envelope tracking power supply signal to the second envelope tracking power supply signal output node based on the boost voltage and a second auxiliary control signal, which is based on the second output current from the second parallel amplifier. In a second mode of operation of the second auxiliary switching power converter, the second auxiliary switching power converter provides the first parallel amplifier supply voltage to the first parallel amplifier based on the boost voltage such that the first parallel amplifier supply voltage is envelope modulated. By operating the first auxiliary switching power converter and the second auxiliary switching power converter in this manner, the overall size of the envelope tracking power converter circuitry can be significantly reduced while providing multiple envelope tracking power supply signals. Further, by envelope modulating the first parallel amplifier supply voltage and the second parallel amplifier supply voltage as discussed above, the efficiency of the envelope tracking power converter circuitry may be improved.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 5:
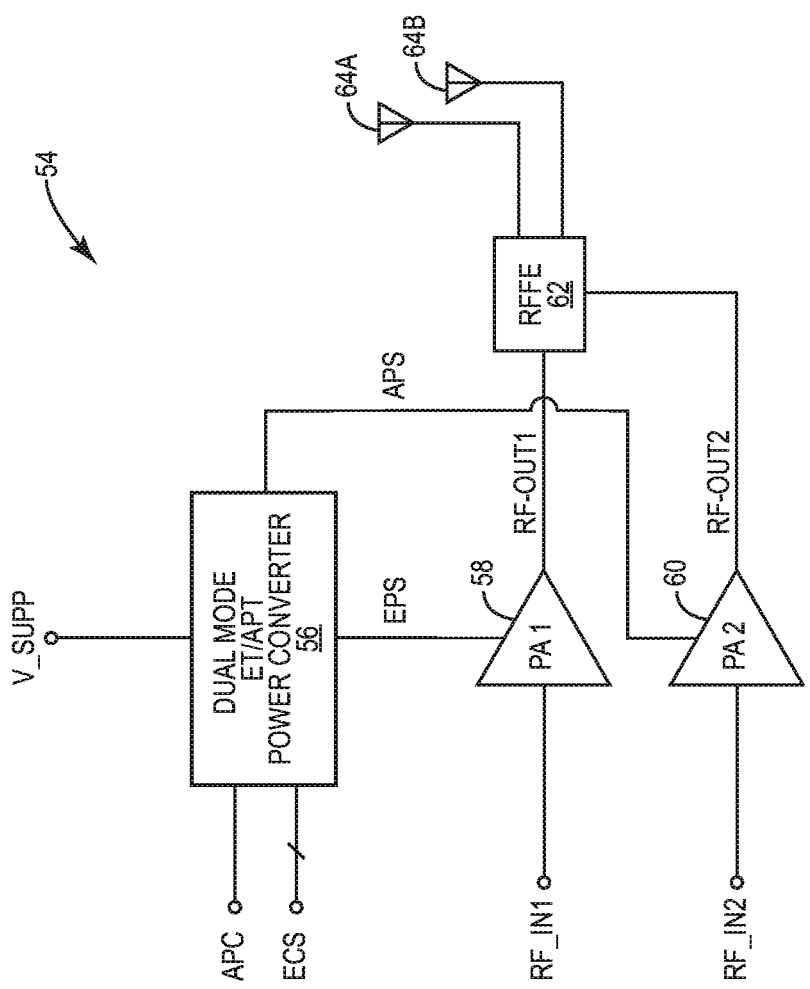
FIG. 5 is a functional schematic illustrating details of an RF transmitter according to one embodiment of the present disclosure.

FIG. 5 shows a radio frequency (RF) transmitter section 54 according to one embodiment of the present disclosure. The RF transmitter section 54 includes dual-mode envelope tracking/average power tracking power converter circuitry 56, a first power amplifier 58, a second power amplifier 60, RF front end circuitry 62, a first antenna 64A, and a second antenna 64B. The dual-mode envelope tracking/average power tracking power converter circuitry 56 is configured to receive a supply voltage V_SUPP, an envelope control signal ECS, which may include multiple control signals, and an average power tracking control signal APC and provide an envelope power supply signal EPS and an average power tracking power supply signal APS. The envelope power supply signal EPS tracks the envelope of a first RF input signal RF_IN1, and is used by the first power amplifier 58 to amplify the first RF input signal RF_IN1 and provide a first RF output signal RF_OUT1. The average power tracking power supply signal APS is used by the second power amplifier 60 to amplify a second RF input signal RF_IN2 and provide a second RF output signal RF_OUT2. The RF front end circuitry 62 receives the first RF output signal RF_OUT1 and the second RF output signal RF_OUT2, performs any necessary filtering and/or routing of the signals, and separately delivers each one of the signals to a different one of the first antenna 64A and the second antenna 64B. Notably, both the first power amplifier 58 and the second power amplifier 60 are powered by the dual-mode envelope tracking/average power tracking power converter circuitry 56. The dual-mode envelope tracking/average power tracking power converter circuitry 56 may be a single integrated circuit. This saves a significant amount of space in the RF transmitter section 54 when compared with conventional solutions that use multiple power converter circuitries to perform the same task.

Notably, the dual-mode envelope tracking/average power tracking power converter circuitry 56 shown in FIG. 5 is only capable of providing the envelope tracking power supply signal EPS to the first power amplifier 58 and providing the average power tracking power supply signal APS to the second power amplifier 60. While using average power tracking may result in reduced efficiency of the second power amplifier 60, this may be an acceptable trade-off for the reductions in size achieved by using the dual-mode envelope tracking/average power tracking power converter circuitry 56. Further, when operating in uplink carrier aggregation modes, the transmit power requirements of the first power amplifier 58 and the second power amplifier 60 are generally reduced (e.g., by −3 dB) to comply with spectral emissions and interference requirements. Accordingly, the power required to operate the second power amplifier 60 will be reduced, which may make the use of average power tracking for the second power amplifier 60 less costly.

The envelope control signal ECS and the average power tracking control signal APC may be generated in any number of different ways, the details of which will be appreciated by those of ordinary skill in the art. For example, envelope tracking circuitry may receive a baseband input signal, an RF input signal RF_IN, an RF output signal RF_OUT, and/or may be in communication with a modulator in order to detect an envelope of the signal. The envelope tracking circuitry may then communicate with a look-up table that provides the envelope control signal ECS based on the detected envelope. In some cases, such a look-up table may provide the envelope control signal ECS according to an isogain contour of the power amplifier to which the envelope power supply signal EPS is provided in order to compensate for changes in linearity of the power amplifier as the envelope power supply signal EPS changes. The average power tracking control signal APC may be generated by examining a desired output power, and may involve referencing a look-up table to determine a desired magnitude of an average power tracking power supply signal APS based on a desired output power, or by any other suitable means.

Figure 6:
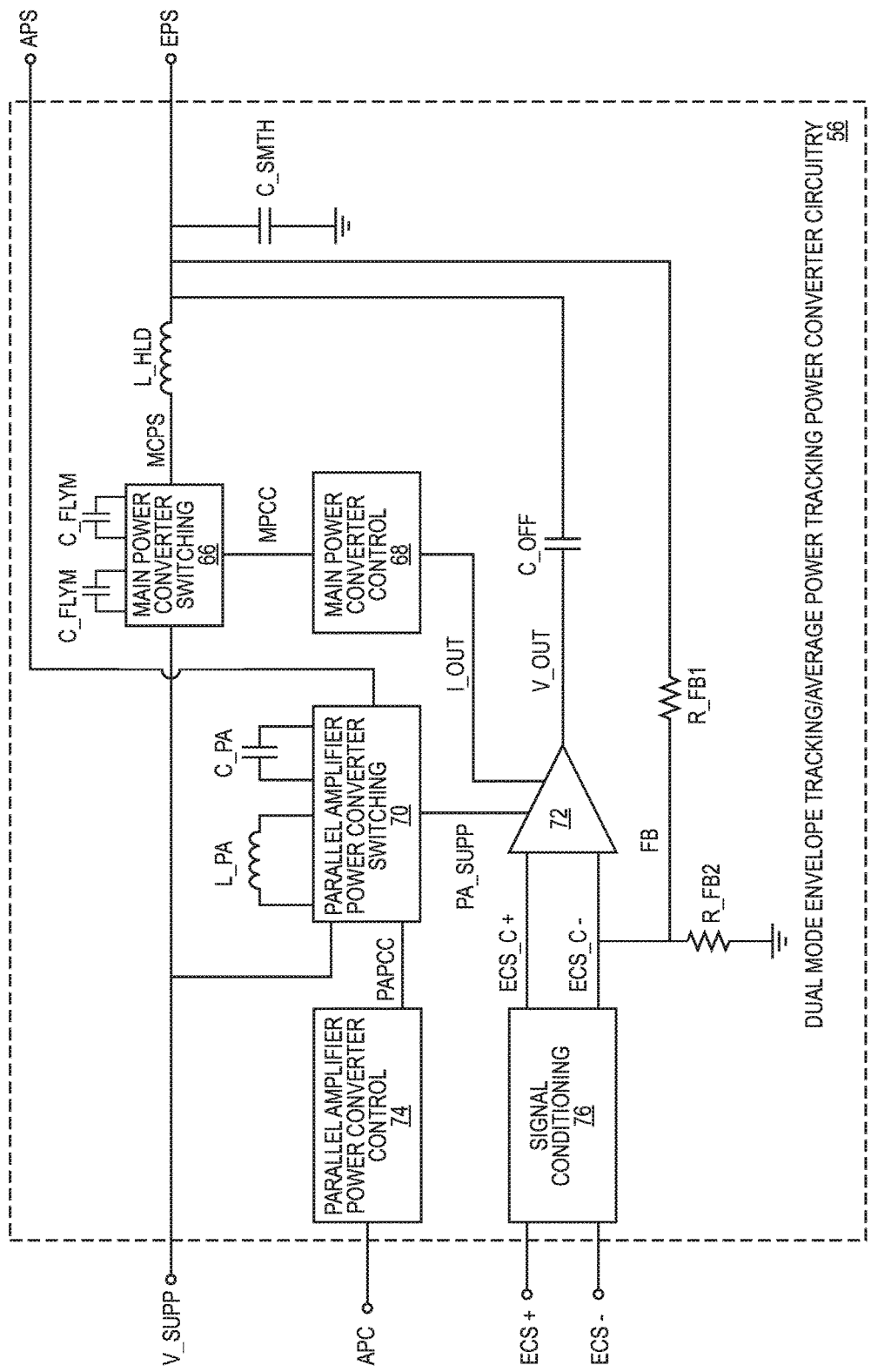
FIG. 6 is a functional schematic illustrating details of dual-mode envelope tracking/average power tracking power converter circuitry according to on embodiment of the present disclosure.

FIG. 6 is a block diagram showing details of the dual-mode envelope tracking/average power tracking power converter circuitry 56 according to one embodiment of the present disclosure. The dual-mode envelope tracking/average power tracking power converter circuitry 56 includes main power converter switching circuitry 66 configured to receive the supply voltage V_SUPP and provide a main converter power supply signal MCPS from a holding inductor L_HLD to a smoothing capacitor C_SMTH. In particular, the main converter power supply signal MCPS is provided based on a main power converter control signal MPCC provided from main power converter control circuitry 68. A number of main power converter flying capacitors C_FLYM and the holding inductor L_HLD are charged and discharged by the main power converter switching circuitry 66 to provide the main converter power supply signal MCPS. The main converter power supply signal MCPS generally comprises the majority of the envelope power supply signal EPS. The smoothing capacitor C_SMTH reduces ripple that may be present in the envelope power supply signal EPS. The main power converter switching circuitry 66 generally forms a buck/boost converter with the main power converter flying capacitors C_FLYM and the holding inductor L_HLD, the details of which will be readily appreciated by those of ordinary skill in the art. The main power converter control signal MPCC may thus include a plurality of control signals each configured to control a different switching element in the main power converter switching circuitry 66 in order to deliver a desired voltage and/or current to the main power converter flying capacitors C_FLYM and the holding inductor L_HLD.

Figure 1:
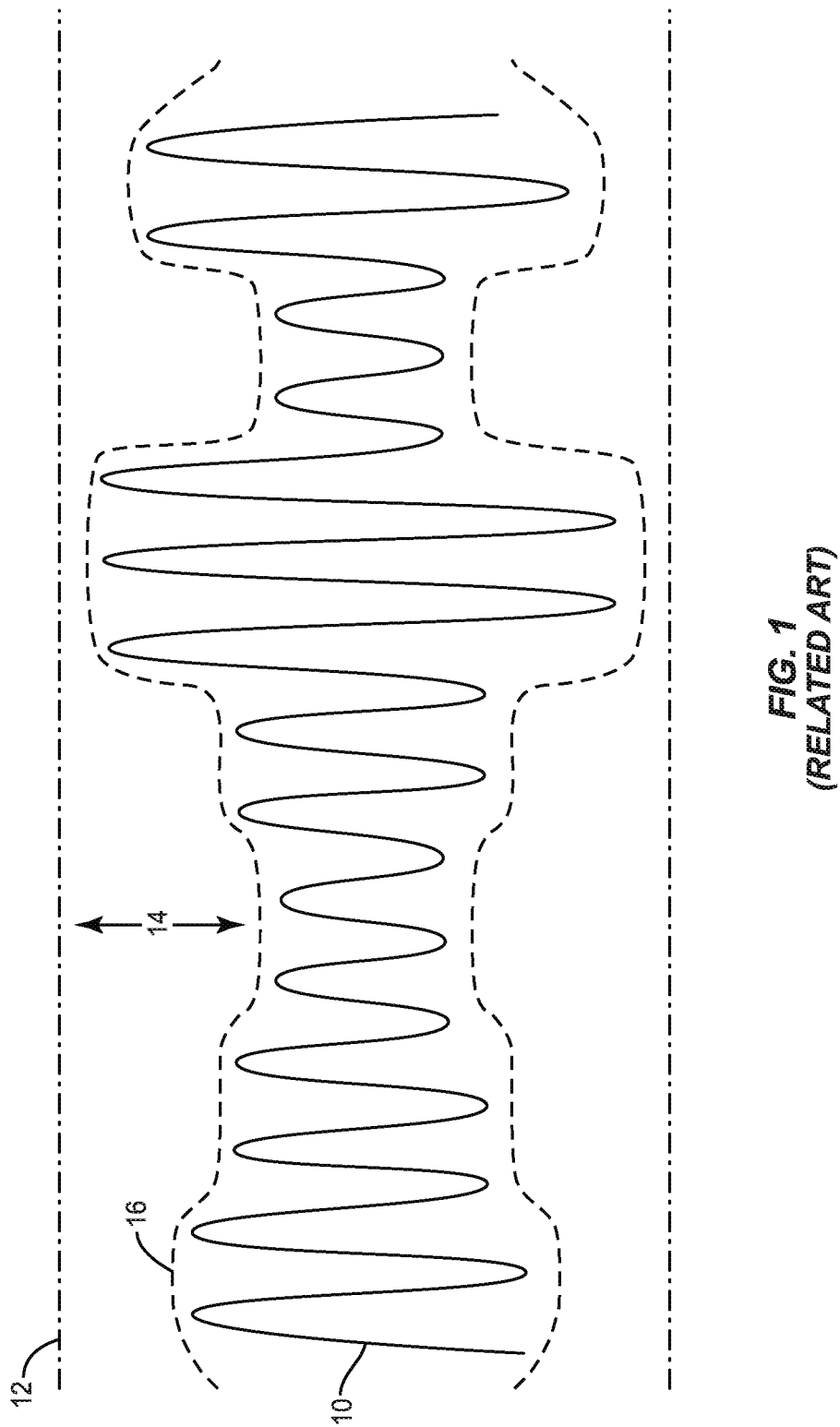
FIG. 1 is a graph illustrating the basic principles of envelope tracking.
Figure 2:
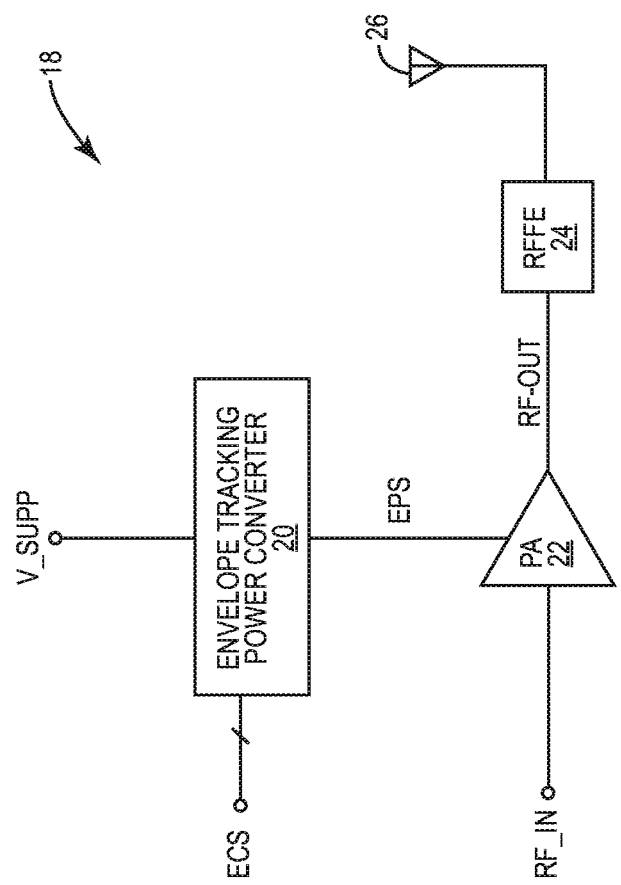
FIG. 2 is a functional schematic illustrating details of a conventional radio frequency (RF) transmitter.
Figure 3:
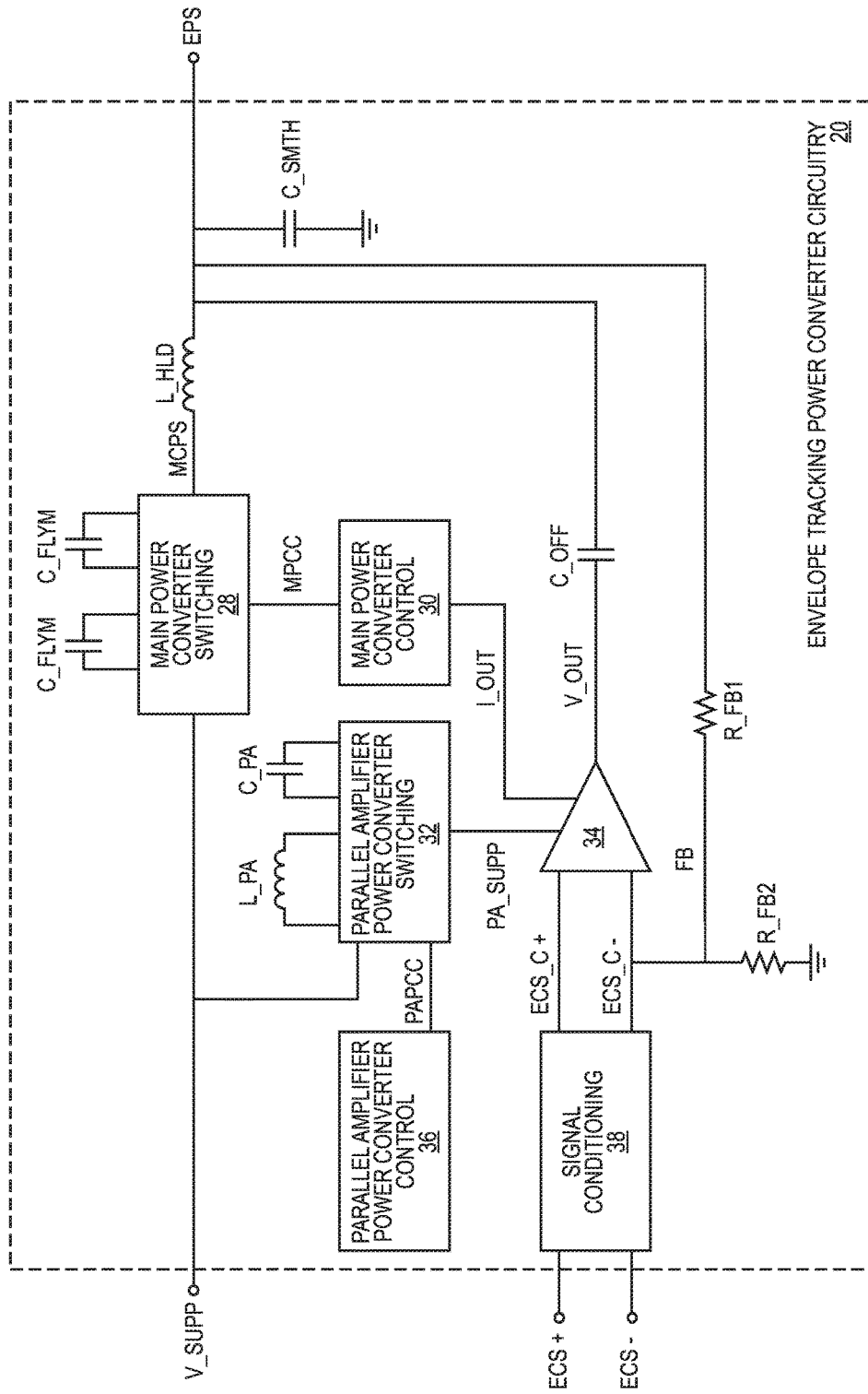
FIG. 3 is a functional schematic illustrating details of conventional envelope tracking power converter circuitry.
Figure 4:
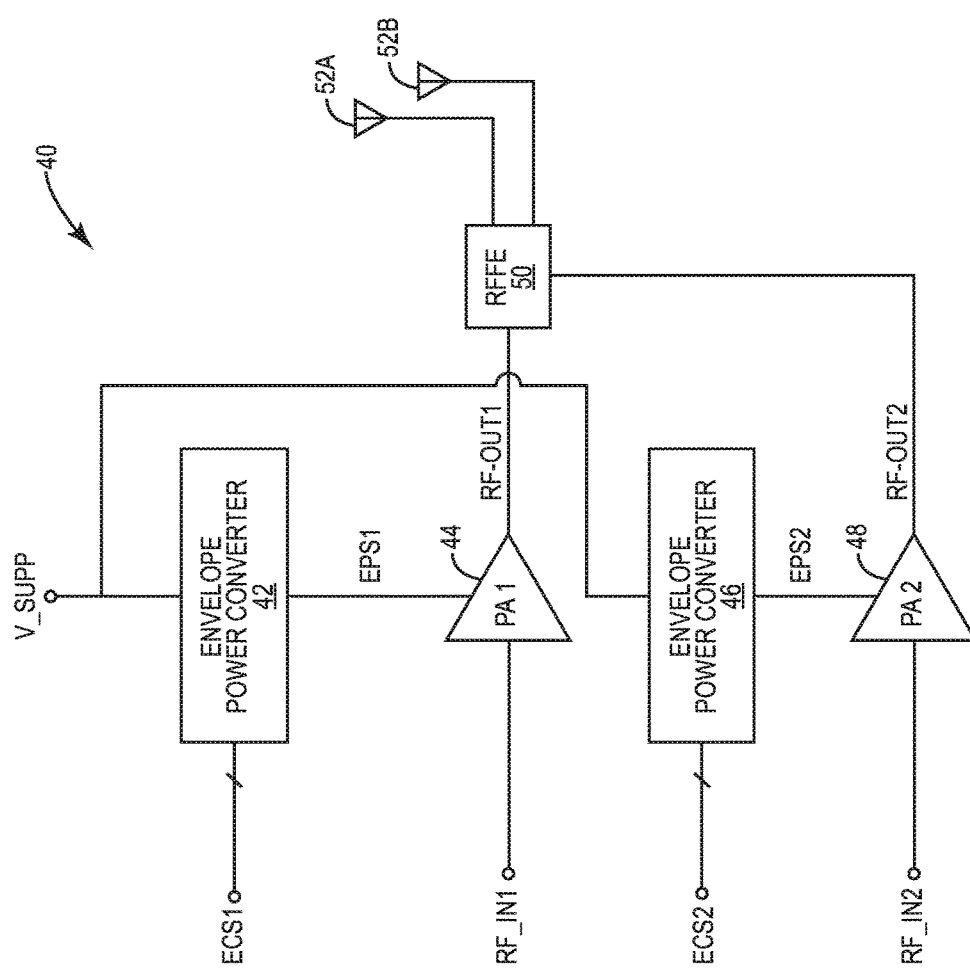
FIG. 4 is a functional schematic illustrating details of an additional conventional RF transmitter.

Parallel amplifier power converter switching circuitry 70 also receives the supply voltage V_SUPP and provides a parallel amplifier supply voltage PA_SUPP to a parallel amplifier 72. In particular, the parallel amplifier power converter switching circuitry 70 charges and discharges a parallel amplifier power converter capacitor C_PA and a parallel amplifier power converter inductor L_PA to provide the parallel amplifier supply voltage PA_SUPP. Additionally, the parallel amplifier power converter switching circuitry 70 provides an average power tracking power supply signal APS. The parallel amplifier supply voltage PA_SUPP is provided based on a parallel amplifier power converter control signal PAPCC, which is provided by parallel amplifier power converter control circuitry 74. Notably, while the main power converter control circuitry 68 and the parallel amplifier power converter control circuitry 74 are shown separately, they may also be provided together in a centralized control circuitry without departing from the principles described herein. The parallel amplifier power converter switching circuitry 70 may form a buck/boost converter with the parallel amplifier power converter capacitor C_PA and the parallel amplifier power converter inductor L_PA, similar to the main power converter switching circuitry 66 discussed above. As discussed above, the power demand of the parallel amplifier 72 will be significantly less than that of a power amplifier for which the envelope power supply signal EPS is generated. Accordingly, the switching components within the parallel amplifier power converter switching circuitry 70 are generally significantly smaller than those in the main power converter switching circuitry 66. Further, the parallel amplifier power converter capacitor C_PA and the parallel amplifier power converter inductor L_PA are generally significantly smaller than the main power converter flying capacitors C_FLYM and the holding inductor L_HLD, respectively. However, in the present embodiment the parallel amplifier power converter switching circuitry 70 may also be providing power to a power amplifier via the average power tracking power supply signal APS (albeit one that is operated in a reduced power state due to the limits on spectral emissions and interference discussed above with respect to uplink carrier aggregation configurations), and thus the switching components therein, along with the parallel amplifier power converter capacitor C_PA and the parallel amplifier power converter inductor L_PA, may be redesigned to handle greater amounts of power. While doing so will increase the overall size of the dual-mode envelope tracking/average power tracking power converter circuitry 56, such an increase is minor compared to providing separate envelope tracking power converter circuitry for each power amplifier used in an uplink carrier aggregation scheme. For example, the dual-mode envelope tracking/average power tracking power converter circuitry 56 may be between 5% and 15% larger than the envelope tracking power converter circuitry shown in FIG. 3 (compared with 200% larger in the case of providing additional envelope power converter circuitry as shown in FIG. 4).

Signal conditioning circuitry 76 receives the envelope control signal(s) ECS, which may be a differential signal. These envelope control signal(s) ECS, which indicate a target value of the envelope power supply signal EPS, are conditioned and forwarded to the parallel amplifier 72 as conditioned envelope control signal(s) ECS_C. Further, the envelope control signal(s) or one or more derivatives thereof are provided to the parallel amplifier power converter control circuitry 74, where they are used to provide to the parallel amplifier power converter control signal PAPCC. In particular, the parallel amplifier power converter control signal PAPCC is used to provide a minimum parallel amplifier supply voltage PA_SUPP necessary for the parallel amplifier 72 to operate and control the envelope power supply signal EPS as discussed below. Additionally, the parallel amplifier power converter control circuitry 74 receives the average power tracking control signal APC, which determines the level of the average power tracking power supply signal APS. Generally, the parallel amplifier power converter switching circuitry 70 can only provide a single voltage and/or current at one time, and therefore the highest amplitude of the power required for the average power tracking power supply signal APS or the parallel amplifier supply voltage PA_SUPP is chosen by the parallel amplifier power converter control circuitry 74. While this will once again result in a decrease in the efficiency of the dual-mode envelope tracking/average power tracking power converter circuitry 56, such a decrease in efficiency may be a desirable trade-off when considering the size of the circuitry.

In addition to the parallel amplifier supply voltage PA_SUPP and the envelope control signal(s) ECS, the parallel amplifier 72 also receives a feedback signal FB via a resistive divider formed from a first feedback resistor R_FB1 and a second feedback resistor R_FB2. Using these signals, the parallel amplifier 72 provides an output voltage V_OUT and an output current I_OUT. Specifically, the parallel amplifier 72 acts similar to an operational amplifier, and attempts to equalize the voltage on an inverted terminal and a non-inverted terminal by changing the output voltage V_OUT and the output current I_OUT thereof. The output voltage V_OUT is delivered to an offset capacitor C_OFF, which is coupled between the holding inductor L_HLD and the smoothing capacitor C_SMTH. In general, the output voltage V_OUT contributes minimally to the envelope power supply signal EPS, acting only as a control mechanism for the main power converter switching circuitry 66. However, in some situations where the main power converter switching circuitry 66 along with the main power converter flying capacitors C_FLYM and the holding inductor L_HLD are incapable of providing or maintaining a particular envelope power supply signal EPS (e.g., due to very high bandwidth of the envelope power supply signal EPS and the fact that the rate of change of the current provided by the holding inductor L_HLD is limited), the output voltage V_OUT may contribute to the envelope power supply signal EPS for short periods of time. The offset capacitor C_OFF, in addition to storing charge that may be required to boost the envelope power supply signal EPS in times of rapid change or large signal amplitudes as discussed above, also reduces the necessary dynamic range of the output voltage V_OUT from the parallel amplifier 72 to maintain full control over the envelope power supply signal EPS. This in turn reduces the necessary parallel amplifier supply voltage PA_SUPP and thus improves efficiency. The output current I_OUT is provided to the main power converter control circuitry 68, and is used to generate the main power converter control signal MPCC. As will be appreciated by those of ordinary skill in the art, the output current I_OUT may be obtained from the parallel amplifier 72 in any number of different ways, all of which are contemplated herein. Accordingly, the parallel amplifier 72 acts primarily as a master device, with the main power converter switching circuitry 66 as a slave device via the output current I_OUT from the parallel amplifier 72. This design choice is due to the fact that the parallel amplifier 72 is a linear amplifier that is not very efficient at providing signals with the dynamic range of the envelope power supply signal EPS, while the main power converter switching circuitry 66 is very efficient at doing so. Operating the main power converter switching circuitry 66 and the parallel amplifier 72 in this manner thus allows for accurate envelope tracking with good efficiency.

By reusing the parallel amplifier power converter switching circuitry 70, the parallel amplifier power converter capacitor C_PA, and the parallel amplifier power converter inductor L_PA to provide the average power tracking power supply signal APS in addition to the parallel amplifier supply voltage P_SUPP, the dual-mode envelope tracking/average power tracking power converter circuitry 56 may simultaneously support envelope tracking and average power tracking, respectively, for two power amplifiers with a minimal increase in size compared to conventional envelope tracking power converter circuitry.

Figures 7A, 7B:
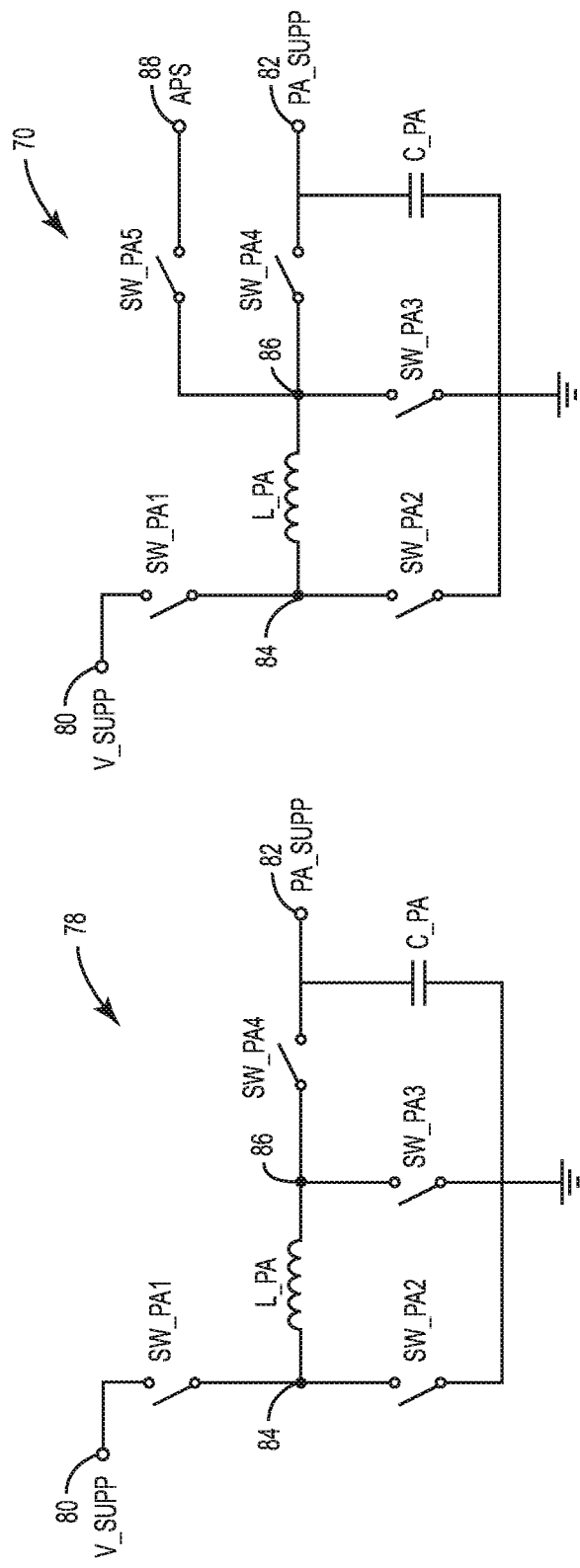
FIGS. 7A and 7B are functional schematics illustrating details of parallel amplifier power converter switching circuitry according to one embodiment of the present disclosure.

FIGS. 7A and 7B illustrate the differences between conventional parallel amplifier power converter switching circuitry 78 and the parallel amplifier power converter switching circuitry 70 configured to operate as discussed above with respect to FIG. 6. Specifically, FIG. 7A illustrates the conventional parallel amplifier power converter switching circuitry 78, while FIG. 7B illustrates details of the parallel amplifier power converter switching circuitry 70 according to one embodiment of the present disclosure. The conventional parallel amplifier power converter switching circuitry 78 includes a supply voltage input node 80, a parallel amplifier supply voltage output node 82, a first parallel amplifier power converter switching element SW_PA1 coupled between the supply voltage input node 80 and a first intermediate node 84, a second parallel amplifier power converter switching element SW_PA2 coupled between the first intermediate node 84 and ground, a third parallel amplifier power converter switching element SW_PA3 coupled between a second intermediate node 86 and ground, and a fourth parallel amplifier power converter switching element SW_PA4 coupled between the second intermediate node 86 and the parallel amplifier supply voltage output node 82. The parallel amplifier power converter inductor L_PA is coupled between the first intermediate node 84 and the second intermediate node 86. The parallel amplifier power converter capacitor C_PA is coupled between the parallel amplifier supply voltage output node 82 and ground. Control signals supplied to each one of the parallel amplifier power converter switching elements SW1_PA1-SW_PA4 charge and discharge the parallel amplifier power converter inductor L_PA and the parallel amplifier power converter capacitor C_PA in order to provide a parallel amplifier supply voltage PA_SUPP with a desired magnitude.

The parallel amplifier power converter switching circuitry 70 is similar to the conventional parallel amplifier power converter switching circuitry 78, and includes the parallel amplifier power converter switching elements SW_PA1-SW_PA4 arranged as discussed above with respect to the parallel amplifier power converter inductor L_PA, and the parallel amplifier power converter capacitor C_PA. The parallel amplifier power converter switching circuitry 70 further includes a fifth parallel amplifier power converter switching element SW_PA5 coupled between the second intermediate node 86 and an average power tracking power supply signal output node 88. Unlike the parallel amplifier power converter switching elements SW_PA1-SW_PA4 described above that are dynamically switched in order to charge and discharge the parallel amplifier power converter inductor L_PA and the parallel amplifier power converter capacitor C_PA, the fifth parallel amplifier power converter switching element SW_PA5 is closed when an average power tracking power supply signal APS is desired, and opened when one is not. As discussed above, the control signals provided to the other parallel amplifier power converter switching elements SW_PA1-SW_PA4 are chosen to provide the higher of the average power tracking power supply signal APS and the parallel amplifier supply voltage PA_SUPP.

As is apparent from the above, an average power tracking power supply signal APS may be achieved by adding a single switch to the parallel amplifier power converter switching circuitry 70 and increasing the power handing capability of the other parallel amplifier power converter switches SW_PA1-SW_PA4 as well as the parallel amplifier power converter inductor L_PA and the parallel amplifier power converter capacitor C_PA. Accordingly, the RF transmitter section 54 may perform uplink carrier aggregation with a minimal increase in the size thereof.

Figure 8:
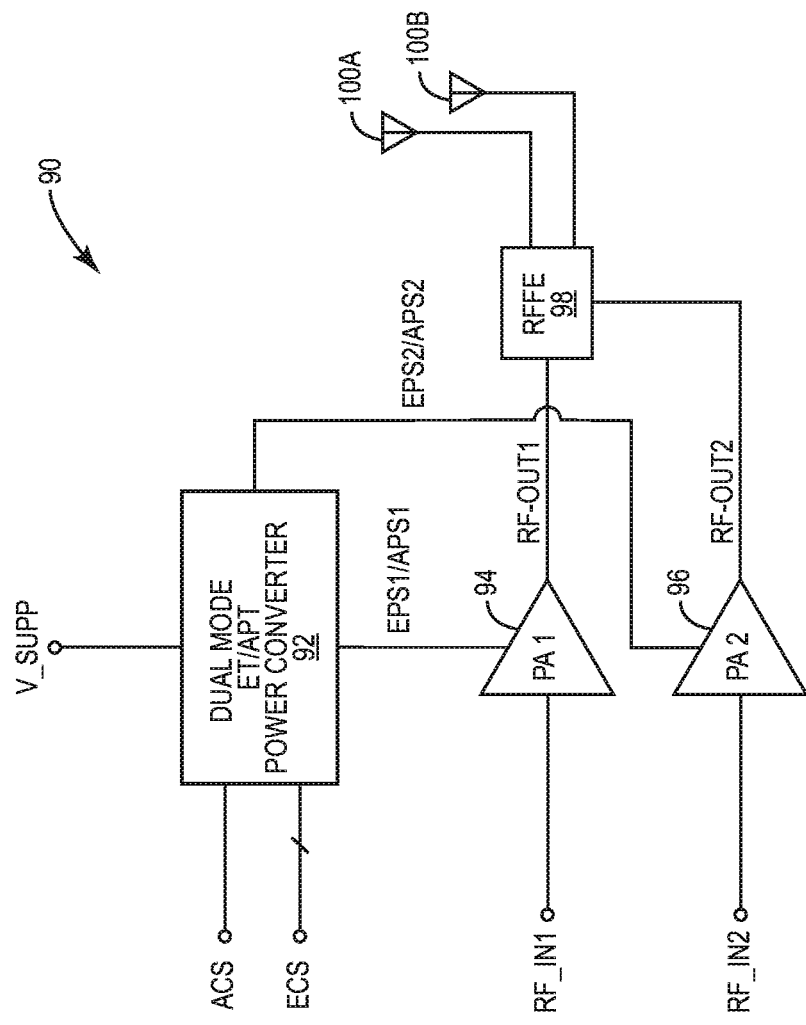
FIG. 8 is a functional schematic illustrating details of an RF transmitter according to one embodiment of the present disclosure.

FIG. 8 shows an RF transmitter section 90 according to an additional embodiment of the present disclosure. The RF transmitter section 90 includes dual-mode envelope tracking/average power tracking power converter circuitry 92, a first power amplifier 94, a second power amplifier 96, RF front end circuitry 98, a first antenna 100A, and a second antenna 100B. The dual-mode envelope tracking/average power tracking power converter circuitry 92 is configured to receive a supply voltage V_SUPP, an envelope control signal ECS, which may include multiple control signals, and an average power tracking control signal APC and provide one of a first envelope power supply signal EPS1 and a first average power tracking power supply signal APS1 to the first power amplifier 94 and provide one of a second envelope power supply signal EPS2 and a second average power tracking power supply signal APS2 to the second power amplifier 96.

Notably, in some embodiments the dual-mode envelope tracking/average power tracking power converter circuitry 92 is only capable of providing one envelope tracking power supply signal at a time. In these embodiments, if the first envelope power supply signal EPS1 is provided to the first power amplifier 94, the second average power tracking signal APS2 is provided to the second power amplifier 96. Further, if the second envelope power supply signal EPS2 is provided to the second power amplifier 96, the first average power tracking signal APS1 is provided to the first power amplifier 94. This is in contrast to the dual-mode envelope tracking/average power tracking power converter circuitry 56 described above in FIG. 5 in which an envelope power supply signal EPS was always provided to the first power amplifier 58 and an average power tracking power supply signal APS was always provided to the second power amplifier 60. In short, the configuration of the present embodiment allows either the first power amplifier 94 or the second power amplifier 96 to receive an envelope tracking power supply signal, thereby increasing the flexibility of the circuitry.

The first envelope power supply signal EPS1, when provided, tracks the envelope of a first RF input signal RF_IN1, and is used by the first power amplifier 94 to amplify the first RF input signal RF_IN1 and provide a first RF output signal RF_OUT1. The first average power tracking signal APS1, when provided, is also used by the first power amplifier 94 to amplify the first RF input signal RF_IN1 and provide the first RF output signal RF_OUT1. The second envelope power supply signal EPS2, when provided, tracks the envelope of a second RF input signal RF_IN2, and is used by the second power amplifier 96 to amplify the second RF input signal RF_IN2 and provide a second RF output signal RF_OUT2. The second average power tracking signal APS2, when provided, is also used by the second power amplifier 96 to amplify the second RF input signal RF_IN2 and provide the second RF output signal RF_OUT2.

The RF front end circuitry 98 receives the first RF output signal RF_OUT1 and the second RF output signal RF_OUT2, performs any necessary filtering and/or routing of the signals, and separately delivers each one of the signals to a different one of the first antenna 100A and the second antenna 100B. Notably, both the first power amplifier 94 and the second power amplifier 96 are powered by the dual-mode envelope tracking/average power tracking power converter circuitry 92. The dual-mode envelope tracking/average power tracking power converter circuitry 92 may be a single integrated circuit. This saves a significant amount of space in the RF transmitter section 90 when compared with conventional solutions that use multiple power converter circuitries to perform the same task.

While using average power tracking may result in reduced efficiency, this may be an acceptable trade-off for the reductions in size achieved by using the dual-mode envelope tracking/average power tracking power converter circuitry 92. Further, when operating in uplink carrier aggregation modes, the transmit power requirements of the first power amplifier 94 and the second power amplifier 96 are generally reduced (e.g., by −3 dB) to comply with spectral emissions and interference requirements. Accordingly, the power required to operate the first power amplifier 94 and the second power amplifier 96 will be reduced, which may make the use of average power tracking less costly.

The first envelope control signal ECS1, the second envelope control signal ECS2, the first average power tracking control signal APC1, and the second average power tracking control signal APC2 may be generated in any number of different ways, the details of which will be appreciated by those of ordinary skill in the art. For example, envelope tracking circuitry may receive a baseband input signal, an RF input signal RF_IN, an RF output signal RF_OUT, and/or may be in communication with a modulator in order to detect an envelope of the signal. This envelope tracking circuitry may then communicate with a look-up table that provides the envelope control signal ECS based on the detected envelope. In some cases, such a look-up table may provide the envelope control signal ECS according to an isogain contour of the power amplifier to which the envelope power supply signal EPS is provided in order to compensate for changes in linearity of the power amplifier as the envelope power supply signal EPS changes. The average power tracking signal APC may be generated by examining a desired magnitude of an average power tracking power supply signal APS based on a desired output power, or by another suitable means.

Figure 9:
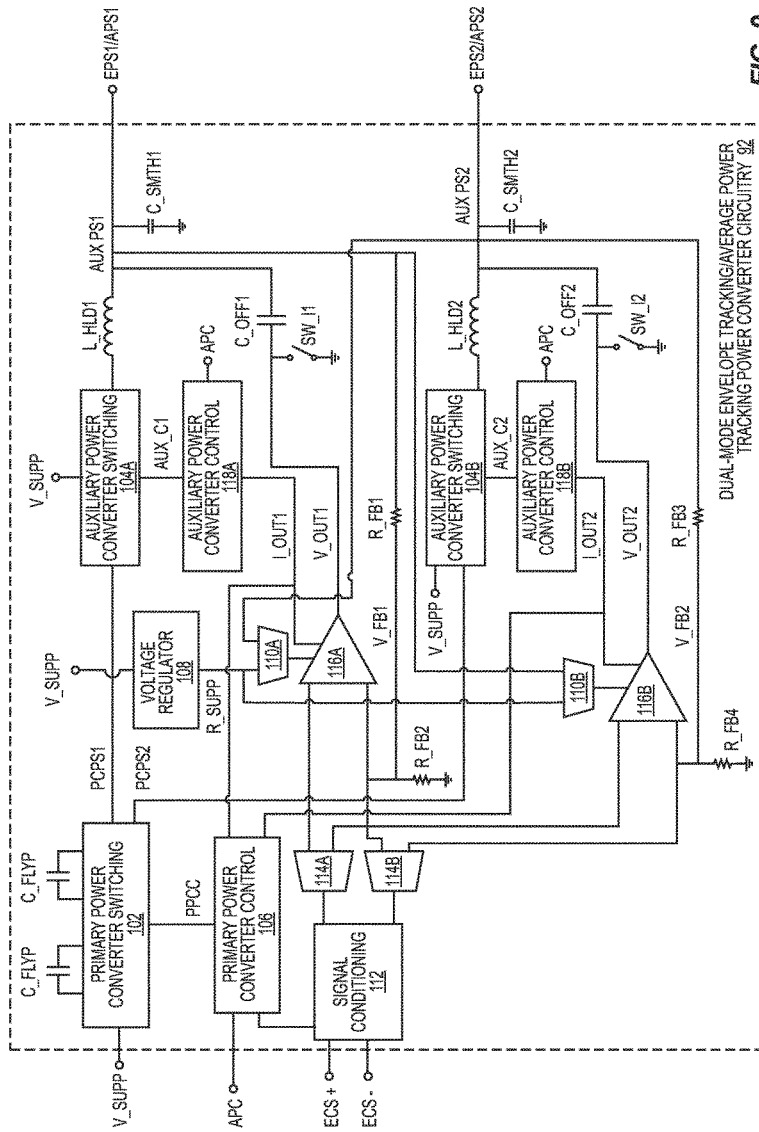
FIG. 9 is a functional schematic illustrating details of dual-mode envelope tracking/average power tracking power converter circuitry according to one embodiment of the present disclosure.

FIG. 9 is a block diagram showing details of the dual-mode envelope tracking/average power tracking power converter circuitry 92 according to one embodiment of the present disclosure. The dual-mode envelope tracking/average power tracking power converter circuitry 92 includes primary power converter switching circuitry 102 configured to receive the supply voltage V_SUPP and provide a first primary converter power supply signal PCPS1 to first auxiliary power converter switching circuitry 104A and a second primary converter power supply signal PCPS2 to second auxiliary power converter switching circuitry 104B. In particular, the first primary converter power supply signal PCPS1 and the second primary converter power supply signal PCPS2 are provided based on a primary power converter control signal PPCC provided from primary power converter control circuitry 106. A number of primary power converter flying capacitors C_FLYP are charged and discharged by the primary power converter switching circuitry 102 to provide the first primary converter power supply signal PCPS1 and the second primary converter power supply signal PCPS2. The primary power converter switching circuitry 102 generally forms a boost converter with the primary power converter flying capacitors C_FLYP, the details of which are discussed below. Notably, a number of switching elements in the primary power converter switching circuitry 102 are arranged such that the first primary converter power supply signal PCPS1 and the second primary converter power supply signal PCPS2 may be provided independently and asynchronously from one another as discussed below.

The first auxiliary power converter switching circuitry 104A receives the first primary converter power supply signal PCPS1 and a first auxiliary control signal AUXC1 and charges and discharges a first holding inductor L_HLD1 to provide a first auxiliary power supply signal AUXPS1. The first auxiliary power converter switching circuitry 104A generally forms a buck converter with the first holding inductor L_HLD1, such that the first primary power converter power supply signal PCPS1 may be further adjusted by the first auxiliary power converter switching circuitry 104A. The first auxiliary power supply signal AUXPS1 generally comprises the majority of the first envelope power supply signal EPS1 or the first average power tracking power supply signal APS1. In certain operating modes, the first auxiliary power supply signal AUXPS1 may also be used as an internal power supply for a parallel amplifier in the dual-mode envelope tracking/average power tracking power converter circuitry 92, the details of which are discussed below.

The second auxiliary power converter switching circuitry 104B receives the second primary converter power supply signal PCPS2 and a second auxiliary control signal AUXC2 and charges and discharges a second holding inductor L_HLD2 to provide a second auxiliary power supply signal AUXPS2. The second auxiliary power converter switching circuitry 104B generally forms a buck converter with the second holding inductor L_HLD2, such that the first primary power converter power supply signal PCPS2 may be further adjusted by the second auxiliary power converter switching circuitry 104B. The second auxiliary power supply signal AUXPS2 generally comprises the majority of the second envelope power supply signal EPS2 or the second average power tracking power supply signal APS2. In certain operating modes, the second auxiliary power supply signal AUXPS2 may also be used as an internal power supply for a parallel amplifier in the dual-mode envelope tracking/average power tracking power converter circuitry 92, the details of which are discussed below.

A voltage regulator 108, which may be a linear voltage regulator (e.g., a low dropout voltage regulator), also receives the supply voltage V_SUPP and provides a regulated supply voltage R_SUPP to a first parallel amplifier supply voltage multiplexer 110A and a second parallel amplifier supply voltage multiplexer 110B. Signal conditioning circuitry 112 receives the envelope control signal(s) ECS, which indicate a target value of either the first envelope tracking power supply signal EPS1 or the second envelope tracking power supply signal EPS2, depending on which is being provided from the dual-mode envelope tracking/average power tracking power converter circuitry 92. The envelope control signal(s) ECS or some derivative thereof are delivered to the primary power converter control circuitry 106, where they are used along with the average power tracking control signal APC to generate the primary power converter control signal PPCC. The average power tracking control signal APC indicates the target value of the first average power tracking power supply signal APS1 or the second average power tracking power supply signal APS2, depending on which is being provided from the dual-mode envelope tracking/average power tracking power converter circuitry 92. The primary power converter control circuitry 106 may provide the primary power converter control signal PPCC based on the larger of the requirements indicated by the envelope control signal(s) EPS and the average power tracking control signal APC. The signal conditioning circuitry 112 may provide filtering and signal processing on the envelope control signal(s) ECS, which are delivered via a first envelope control signal multiplexer 114A and a second envelope control signal multiplexer 114B to one of a first parallel amplifier 116A and a second parallel amplifier 116B. Which one of the first parallel amplifier 116A and the second parallel amplifier 116B receive the envelope control signal(s) ECS depends on if the first envelope power supply signal EPS1 is being provided (first parallel amplifier 116A) or the second envelope power supply signal EPS2 is being provided (second parallel amplifier 116B).

When the first envelope power supply signal EPS1 is being provided from the dual-mode envelope tracking/average power tracking power converter circuitry 92, the first parallel amplifier 116A receives the envelope control signal(s) ECS, a first feedback signal V_FB1 via a resistive divider formed from a first feedback resistor R_FB1 and a second feedback resistor R_FB2, and a first parallel amplifier supply voltage PA_SUPP1, which is one of the regulated supply voltage R_SUPP and the second auxiliary power supply voltage AUXPS2. Which one of the regulated supply voltage R_SUPP and the second auxiliary power supply voltage AUXPS2 depends on the operating mode of the dual-mode envelope tracking/average power tracking power converter circuitry 92, as discussed below. Using these signals, the first parallel amplifier 116A provides a first output voltage V_OUT1 and a first output current I_OUT1. Specifically, the first parallel amplifier 116A acts similar to an operational amplifier, and attempts to equalize the voltage on an inverted terminal and a non-inverted terminal by changing the first output voltage V_OUT1 and the first output current I_OUT1 thereof.

The first output voltage V_OUT1 is delivered to a first offset capacitor C_OFF1, which is coupled between the first holding inductor L_HLD1 and the first smoothing capacitor C_SMTH1. In general, the first output voltage V_OUT1 contributes minimally to the first envelope power supply signal EPS1, acting only as a control mechanism for the first auxiliary power converter switching circuitry 104A. However, in some situations where the first auxiliary power converter switching circuitry 104A and the first holding inductor L_HLD1 is incapable of providing or maintaining a particular first envelope power supply signal EPS1 (e.g., due to very high bandwidth of the first envelope power supply signal EPS1 and the fact that the rate of change of the current provided by the first holding inductor L_HLD1 is limited), the first output voltage V_OUT1 may contribute to the first envelope power supply signal EPS1 for short periods of time. The first offset capacitor C_OFF1, in addition to storing charge that may be required to boost the first envelope power supply signal EPS1 in times of rapid change or large signal amplitudes as discussed above, also reduces the necessary dynamic range of the first output voltage V_OUT1 from the first parallel amplifier 116A to maintain full control over the first envelope power supply signal EPS1. This in turn reduces the necessary first parallel amplifier supply voltage PA_SUPP1 and thus improves efficiency.

The first output current I_OUT1 is provided to first auxiliary power converter control circuitry 118A, which provides the first auxiliary control signal AUXC1 to the first auxiliary power converter switching circuitry 104A based thereon. Accordingly, the first parallel amplifier 116A acts primarily as a master device, while the first auxiliary power converter switching circuitry 104A acts as a slave device via the first output current I_OUT1 from the first parallel amplifier 116A. This design choice is due to the fact that the first parallel amplifier 116A is a linear amplifier that is not very efficient at providing signals with the dynamic range of the first envelope power supply signal EPS1, while the first auxiliary power converter switching circuitry 104A along with the primary power converter switching circuitry 102 and the associated energy storage components are very efficient at doing so. Providing the first envelope power supply signal EPS1 in this manner thus allows for accurate envelope tracking with good efficiency.

When the first average power tracking power supply signal APS1 is being provided from the dual-mode envelope tracking/average power tracking power converter circuitry 92, the first parallel amplifier 116A is inactive. Rather than the first output current I_OUT1 from the first parallel amplifier 116A, the first auxiliary power converter control circuitry 118A provides the first auxiliary control signal AUXC1 based on the average power tracking control signal APC. A first isolation switch SW_I1 coupled between an output of the first parallel amplifier 116A and ground may be closed in order to isolate the first parallel amplifier 116A in its inactive state. Further, the second parallel amplifier supply voltage multiplexer 110B may provide the first auxiliary power supply signal AUXPS1 to the second parallel amplifier 116B, where it may be used as a power supply for the second parallel amplifier 116B as discussed below. Accordingly, when providing the first average power tracking power supply signal APS1, the first auxiliary power converter switching circuitry 104A provides both the first average power tracking power supply signal APS1 and acts as an internal power supply for the second parallel amplifier 116B. This foregoes the need for the parallel amplifier power converter switching circuitry 70 shown above in FIG. 5, thus saving significant space in the dual-mode envelope tracking/average power tracking power converter circuitry 92.

When the second envelope power supply signal EPS2 is being provided from the dual-mode envelope tracking/average power tracking power converter circuitry 92, the second parallel amplifier 116B receives the envelope control signal(s) ECS, a second feedback signal V_FB2 via a resistive divider formed from a third feedback resistor R_FB3 and a fourth feedback resistor R_FB4, and a second parallel amplifier supply voltage PA_SUPP2, which is one of the regulated supply voltage R_SUPP and the first auxiliary power supply voltage AUXPS1. Which one of the regulated supply voltage R_SUPP and the first auxiliary power supply voltage AUXPS1 depends on the operating mode of the dual-mode envelope tracking/average power tracking power converter circuitry 92. Using these signals, the second parallel amplifier 116B provides a second output voltage V_OUT2 and a second output current I_OUT2. Specifically, the second parallel amplifier 116B acts similar to an operational amplifier, and attempts to equalize the voltage on an inverted terminal and a non-inverted terminal by changing the second output voltage V_OUT2 and the second output current I_OUT2.

The second output voltage V_OUT2 is delivered to a second offset capacitor C_OFF2, which is coupled between the second holding inductor L_HLD2 and the second smoothing capacitor C_SMTH2. In general, the second output voltage V_OUT2 contributes minimally to the second envelope power supply signal EPS2, acting only as a control mechanism for the second auxiliary power converter switching circuitry 104B. However, in some situations where the second auxiliary power converter switching circuitry 104B is incapable of providing or maintaining a particular second envelope power supply signal EPS2 (e.g., due to very high bandwidth of the second envelope power supply signal EPS2 and the fact that the rate of change of the current provided by the second holding inductor L_HLD2 is limited), the second output voltage V_OUT2 may contribute to the second envelope power supply signal EPS2 for short periods of time. The second offset capacitor C_OFF2, in addition to storing charge that may be required to boost the second envelope power supply signal EPS2 in times of rapid change or large signal amplitudes as discussed above, also reduces the necessary dynamic range of the second output voltage V_OUT2 from the second parallel amplifier 116B to maintain full control over the second envelope power supply signal EPS2. This in turn reduces the necessary second parallel amplifier supply voltage PA_SUPP2 and thus improves efficiency.

The second output current I_OUT2 is provided to second auxiliary power converter control circuitry 118B, which provides the second auxiliary control signal AUXC2 to the second auxiliary power converter switching circuitry 104B based thereon. Accordingly, the second parallel amplifier 116B acts primarily as a master device, while the second auxiliary power converter switching circuitry 104B acts as a slave device via the second output current I_OUT2 from the second parallel amplifier 116B. This design choice is due to the fact that the second parallel amplifier 116B is a linear amplifier that is not very efficient at providing signals with the dynamic range of the second envelope power supply signal EPS2, while the second auxiliary power converter switching circuitry 104B along with the primary power converter switching circuitry 102 and their associated energy storage components are very efficient at doing so. Providing the second envelope power supply signal EPS2 in this manner thus allows for accurate envelope tracking with good efficiency.

When the second average power tracking power supply signal APS2 is being provided from the dual-mode envelope tracking/average power tracking power converter circuitry 92, the second parallel amplifier 116B is inactive. Rather than the second output current I_OUT2 from the second parallel amplifier 116B, the second auxiliary power converter control circuitry 118B provides the second auxiliary control signal AUXC2 based on the average power tracking control signal APC. A second isolation switch SW_I2 coupled between an output of the second parallel amplifier 116B and ground may be closed in order to isolate the second parallel amplifier 116B in its inactive state. Further, the first parallel amplifier supply voltage multiplexer 110A may provide the second auxiliary power supply signal AUXPS2 to the first parallel amplifier 116A, where it may be used as the first parallel amplifier power supply signal PA_SUPP1. Accordingly, when providing the second average power tracking power supply signal APS2, the second auxiliary power converter switching circuitry 104B provides both the second average power tracking power supply signal APS2 and acts as an internal power supply for the first parallel amplifier 116A. This foregoes the need for the parallel amplifier power converter switching circuitry 70 shown above in FIG. 5, thus saving significant space in the dual-mode envelope tracking/average power tracking power converter circuitry 92.

Figure 10:
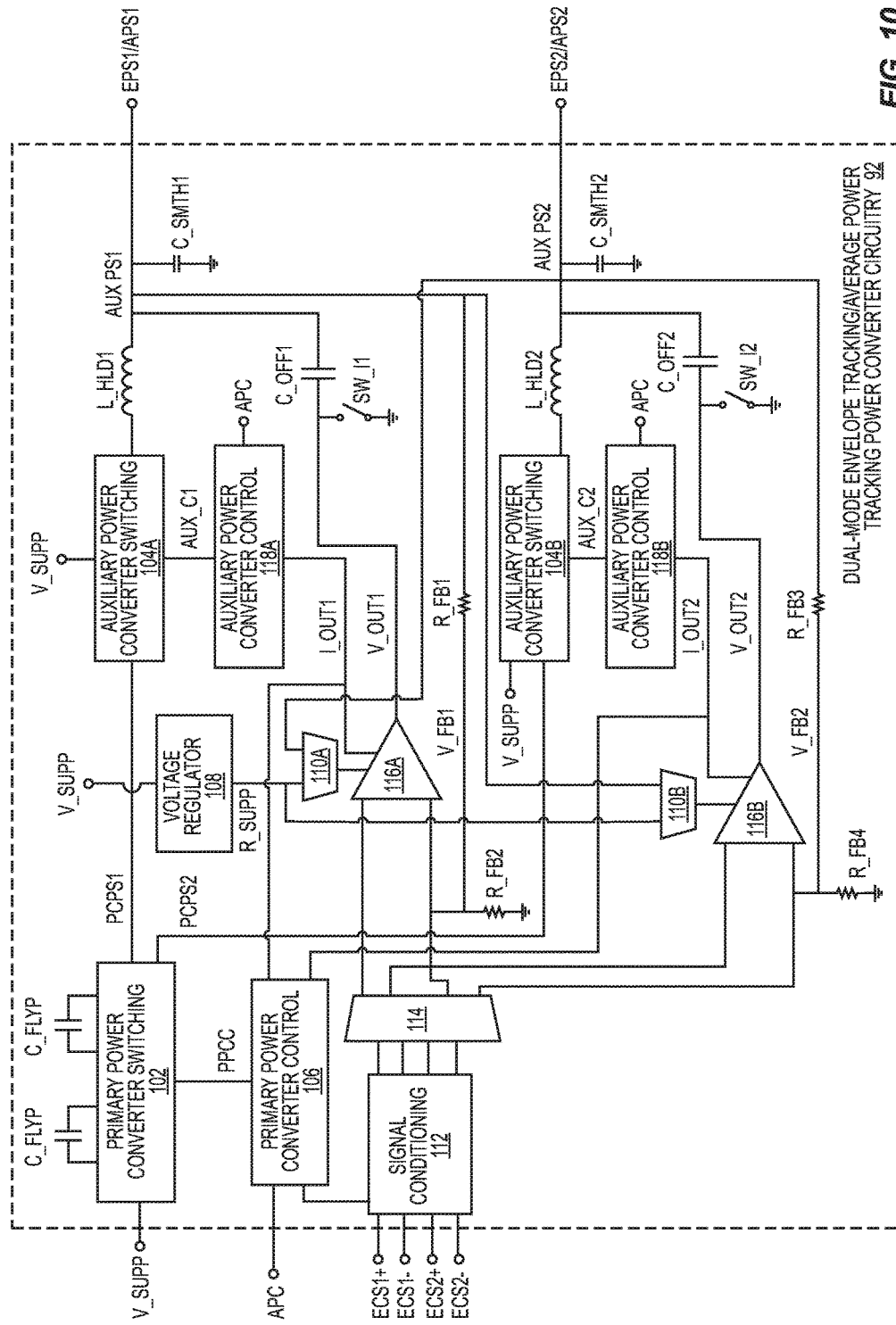
FIG. 10 is a functional schematic illustrating details of dual-mode envelope tracking/average power tracking power converter circuitry according to one embodiment of the present disclosure.

As discussed above, the dual-mode envelope tracking/average power tracking power converter circuitry 92 shown in FIG. 9 may only be capable of providing a single envelope tracking power supply signal at a time. This may result in reduced efficiency of the RF transmitter section 90 shown in FIG. 8 for the reasons discussed above. Accordingly, it may be advantageous in some circumstances for the dual-mode envelope tracking/average power tracking power converter circuitry 92 to simultaneously provide two different envelope power supply signals. FIG. 10 thus shows the dual-mode envelope tracking/average power tracking power converter circuitry 92 according to an additional embodiment of the present disclosure.

The dual-mode envelope tracking/average power tracking power converter circuitry 92 shown in FIG. 10 is substantially similar to that shown in FIG. 9, except that the signal conditioning circuitry 112 receives first envelope control signal(s) ECS1 and second envelope control signal(s) ECS2. Further, the first envelope control signal multiplexer 114A and the second envelope control signal multiplexer 114B are replaced with a single envelope control signal multiplexer 114 configured to provide the first envelope control signal(s) ECS1 to a first one of the first parallel amplifier 116A and the second parallel amplifier 116B and provide the second envelope control signal(s) ECS2 to a second one of the first parallel amplifier 116A and the second parallel amplifier 116B.

When providing an envelope power supply signal and an average power tracking power supply signal, the dual-mode envelope tracking/average power tracking power converter circuitry 92 operates as described above in FIG. 9. When simultaneously providing two envelope power supply signals, the first parallel amplifier supply voltage multiplexer 110A is configured to provide the regulated supply voltage R_SUPP to the first parallel amplifier 116A and the second parallel amplifier supply voltage multiplexer 110B is configured to provide the regulated supply voltage R_SUPP to the second parallel amplifier 116B. Accordingly, both the first parallel amplifier 116A and the second parallel amplifier 116B are powered via the voltage regulator 108 in this situation. The first parallel amplifier 116A and the second parallel amplifier 116B function as described above when providing an envelope power supply signal to simultaneously provide the first envelope power supply signal EPS1 and the second envelope power supply signal EPS2 using first envelope control signal(s) ECS1 and second envelope control signal(s) ECS2. As discussed above, using the voltage regulator 108 is less efficient than using a switching power converter such as the one described above in FIG. 5. However, the voltage regulator 108 consumes much less space than a switching power converter. Accordingly, the trade-off in efficiency vs. area consumption may be desirable in some situations, especially when simultaneously envelope tracking power supply signals are not always provided from the dual-mode envelope tracking/average power tracking power converter circuitry 92.

As discussed above, in various modes of the dual-mode envelope tracking/average power tracking power converter circuitry 92, the first auxiliary power converter switching circuitry 104A may provide a first auxiliary power supply signal AUXPS1 to the second parallel amplifier 116B, where it may be used as the first parallel amplifier power supply signal PA_SUPP1. Similarly, in some modes the second auxiliary power converter switching circuitry 104B may provide a second auxiliary power supply signal AUXPS2 to the first parallel amplifier 116A, where it may be used as the second parallel amplifier power supply signal PA_SUPP2. As discussed above, the first auxiliary power supply signal AUXPS1 and the second auxiliary power supply signal AUXPS2 are average power tracking signals in these modes of operation. While using the first auxiliary power converter switching circuitry 104A and the second auxiliary power converter switching circuitry 104B as described above may allow for a reduction in size in the dual-mode envelope tracking/average power tracking power converter circuitry 92, there is room for improvement from an efficiency standpoint. Specifically, when the dual-mode envelope tracking/average power tracking power converter circuitry 92 is providing a single envelope tracking power supply signal, the auxiliary power converter switching circuitry not providing the envelope tracking power supply signal may be used to provide an envelope modulated parallel amplifier power supply signal in order to increase efficiency as discussed below.

When only the first envelope tracking power supply signal EPS1 is being provided from the dual-mode envelope tracking/average power tracking power converter circuitry 92, the first parallel amplifier 116A receives the first envelope control signal(s) ECS1, the first feedback signal V_FB1 via a resistive divider formed from the first feedback resistor R_FB1 and the second feedback resistor R_FB2, and the first parallel amplifier supply voltage PA_SUPP1, which is the second auxiliary power supply voltage AUXPS2 that has been envelope modulated to improve efficiency. Using these signals, the first parallel amplifier 116A provides a first output voltage V_OUT1 and a first output current I_OUT1. Specifically, the first parallel amplifier 116A acts similar to an operational amplifier, and attempts to equalize the voltage on an inverted terminal and a non-inverted terminal by changing the first output voltage V_OUT1 and the first output current I_OUT1 thereof.

The first output voltage V_OUT1 is delivered to a first offset capacitor C_OFF1, which is coupled between the first holding inductor L_HLD1 and the first smoothing capacitor C_SMTH1. In general, the first output voltage V_OUT1 contributes minimally to the first envelope power supply signal EPS1, acting only as a control mechanism for the first auxiliary power converter switching circuitry 104A. However, in some situations where the first auxiliary power converter switching circuitry 104A and the first holding inductor L_HLD1 is incapable of providing or maintaining a particular first envelope power supply signal EPS1 (e.g., due to very high bandwidth of the first envelope power supply signal EPS1 and the fact that the rate of change of the current provided by the first holding inductor L_HLD1 is limited), the first output voltage V_OUT1 may contribute to the first envelope power supply signal EPS1 for short periods of time. The first offset capacitor C_OFF1, in addition to storing charge that may be required to boost the first envelope power supply signal EPS1 in times of rapid change or large signal amplitudes as discussed above, also reduces the necessary dynamic range of the first output voltage V_OUT1 from the first parallel amplifier 116A to maintain full control over the first envelope power supply signal EPS1. This in turn reduces the necessary first parallel amplifier supply voltage PA_SUPP1 and thus improves efficiency.

The first output current I_OUT1 is provided to first auxiliary power converter control circuitry 118A, which provides the first auxiliary control signal AUXC1 to the first auxiliary power converter switching circuitry 104A based thereon. Accordingly, the first parallel amplifier 116A acts primarily as a master device, while the first auxiliary power converter switching circuitry 104A acts as a slave device via the first output current I_OUT1 from the first parallel amplifier 116A. This design choice is due to the fact that the first parallel amplifier 116A is a linear amplifier that is not very efficient at providing signals with the dynamic range of the first envelope power supply signal EPS1, while the first auxiliary power converter switching circuitry 104A along with the primary power converter switching circuitry 102 and the associated energy storage components are very efficient at doing so. Providing the first envelope power supply signal EPS1 in this manner thus allows for accurate envelope tracking with good efficiency.

To provide the second auxiliary power supply voltage AUXPS2 as an envelope modulated signal, the second parallel amplifier 116B receives the second envelope control signal(s) ECS2, the second feedback signal V_FB2 via a resistive divider formed from the third feedback resistor R_FB3 and a fourth feedback resistor R_FB4, and the second parallel amplifier supply voltage PA_SUPP2, which is the regulated supply voltage R_SUPP. Using these signals, the second parallel amplifier 116B provides a second output voltage V_OUT2 and a second output current I_OUT2. Specifically, the second parallel amplifier 116B acts similar to an operational amplifier, and attempts to equalize the voltage on an inverted terminal and a non-inverted terminal by changing the second output voltage V_OUT2 and the second output current I_OUT2.

The second output voltage V_OUT2 is delivered to a second offset capacitor C_OFF2, which is coupled between the second holding inductor L_HLD2 and the second smoothing capacitor C_SMTH2. In general, the second output voltage V_OUT2 contributes minimally to the second auxiliary power supply voltage AUXPS2, acting only as a control mechanism for the second auxiliary power converter switching circuitry 104B. However, in some situations where the second auxiliary power converter switching circuitry 104B is incapable of providing or maintaining a particular second auxiliary power supply voltage AUXPS2 (e.g., due to very high bandwidth of the second auxiliary power supply voltage AUXPS2 and the fact that the rate of change of the current provided by the second holding inductor L_HLD2 is limited), the second output voltage V_OUT2 may contribute to the second auxiliary power supply voltage AUXPS2 for short periods of time. The second offset capacitor C_OFF2, in addition to storing charge that may be required to boost the second auxiliary power supply signal AUXPS2 in times of rapid change or large signal amplitudes as discussed above, also reduces the necessary dynamic range of the second output voltage V_OUT2 from the second parallel amplifier 116B to maintain full control over the second auxiliary power supply signal AUXPS2. This in turn reduces the necessary second parallel amplifier supply voltage PA_SUPP2 and thus improves efficiency.

The second output current I_OUT2 is provided to second auxiliary power converter control circuitry 118B, which provides the second auxiliary control signal AUXC2 to the second auxiliary power converter switching circuitry 104B based thereon. Accordingly, the second parallel amplifier 116B acts primarily as a master device, while the second auxiliary power converter switching circuitry 104B acts as a slave device via the second output current I_OUT2 from the second parallel amplifier 116B. This design choice is due to the fact that the second parallel amplifier 116B is a linear amplifier that is not very efficient at providing signals with the dynamic range of the second auxiliary power supply signal AUXPS2, while the second auxiliary power converter switching circuitry 104B along with the primary power converter switching circuitry 102 and their associated energy storage components are very efficient at doing so. Providing the second auxiliary power supply signal AUXPS2 in this manner thus allows for accurate envelope tracking with good efficiency.

The second envelope control signal(s) ECS2 are provided such that the second auxiliary power supply signal AUXPS2 is envelope modulated at the same or a lower frequency than the first envelope tracking power supply signal EPS1. Generally, the modulation of the second auxiliary power supply signal AUXPS2 will occur within a different voltage range than the first envelope tracking power supply signal EPS1 due to the offset in voltage provided by the first offset capacitor C_OFF1. This may be compensated for in the second envelope control signal(s) ECS2. Further, the bandwidth of the second auxiliary power supply signal AUXPS2 may be limited in order to improve efficiency in some cases. For example, the bandwidth of the second auxiliary power supply signal AUXPS2 may be lower than that of the first envelope tracking power supply signal EPS1, since the second parallel amplifier 116B is supplied from the voltage regulator 108 and thus may suffer from poor efficiency when operated at high bandwidth and/or dynamic range. Any number of different envelope tracking control schemes may be used to provide the second auxiliary power supply signal AUXPS2 to improve the efficiency of the dual-mode envelope tracking/average power tracking power converter circuitry 92, the details of which will be appreciated by those of ordinary skill in the art.

When only the second envelope tracking power supply signal EPS2 is being provided from the dual-mode envelope tracking/average power tracking power converter circuitry 92, the second parallel amplifier 116B receives the second envelope control signal(s) ECS2, the second feedback signal V_FB2 via a resistive divider formed from the third feedback resistor R_FB3 and a fourth feedback resistor R_FB4, and the second parallel amplifier supply voltage PA_SUPP2, which is the first auxiliary power supply signal AUXPS1 that has been envelope modulated to improve efficiency. Using these signals, the second parallel amplifier 116B provides a second output voltage V_OUT2 and a second output current I_OUT2. Specifically, the second parallel amplifier 116B acts similar to an operational amplifier, and attempts to equalize the voltage on an inverted terminal and a non-inverted terminal by changing the second output voltage V_OUT2 and the second output current I_OUT2.

The second output voltage V_OUT2 is delivered to a second offset capacitor C_OFF2, which is coupled between the second holding inductor L_HLD2 and the second smoothing capacitor C_SMTH2. In general, the second output voltage V_OUT2 contributes minimally to the second envelope power supply signal EPS2, acting only as a control mechanism for the second auxiliary power converter switching circuitry 104B. However, in some situations where the second auxiliary power converter switching circuitry 104B is incapable of providing or maintaining a particular second envelope power supply signal EPS2 (e.g., due to very high bandwidth of the second envelope power supply signal EPS2 and the fact that the rate of change of the current provided by the second holding inductor L_HLD2 is limited), the second output voltage V_OUT2 may contribute to the second envelope power supply signal EPS2 for short periods of time. The second offset capacitor C_OFF2, in addition to storing charge that may be required to boost the second envelope power supply signal EPS2 in times of rapid change or large signal amplitudes as discussed above, also reduces the necessary dynamic range of the second output voltage V_OUT2 from the second parallel amplifier 116B to maintain full control over the second envelope power supply signal EPS2. This in turn reduces the necessary second parallel amplifier supply voltage PA_SUPP2 and thus improves efficiency.

The second output current I_OUT2 is provided to second auxiliary power converter control circuitry 118B, which provides the second auxiliary control signal AUXC2 to the second auxiliary power converter switching circuitry 104B based thereon. Accordingly, the second parallel amplifier 116B acts primarily as a master device, while the second auxiliary power converter switching circuitry 104B acts as a slave device via the second output current I_OUT2 from the second parallel amplifier 116B. This design choice is due to the fact that the second parallel amplifier 116B is a linear amplifier that is not very efficient at providing signals with the dynamic range of the second envelope power supply signal EPS2, while the second auxiliary power converter switching circuitry 104B along with the primary power converter switching circuitry 102 and their associated energy storage components are very efficient at doing so. Providing the second envelope power supply signal EPS2 in this manner thus allows for accurate envelope tracking with good efficiency.

To provide the first auxiliary power supply voltage AUXPS1 as an envelope modulated signal, the first parallel amplifier 116A receives the first envelope control signal(s) ECS1, the first feedback signal V_FB1 via a resistive divider formed form the first feedback resistor R_FB1 and the second feedback resistor R_FB2, and the first parallel amplifier supply voltage PA_SUPP1, which is the regulated supply voltage R_SUPP. Using these signals, the first parallel amplifier 116A provides a first output voltage V_OUT1 and a first output current I_OUT1. Specifically, the first parallel amplifier 116A acts similar to an operational amplifier, and attempts to equalize the voltage on an inverted terminal and a non-inverted terminal by changing the first output voltage V_OUT1 and the first output current I_OUT1 thereof.

The first output voltage V_OUT1 is delivered to a first offset capacitor C_OFF1, which is coupled between the first holding inductor L_HLD1 and the first smoothing capacitor C_SMTH1. In general, the first output voltage V_OUT1 contributes minimally to the first auxiliary power supply signal AUXPS1, acting only as a control mechanism for the first auxiliary power converter switching circuitry 104A. However, in some situations where the first auxiliary power converter switching circuitry 104A and the first holding inductor L_HLD1 is incapable of providing or maintaining a particular first auxiliary power supply signal AUXPS1 (e.g., due to very high bandwidth of the first auxiliary power supply signal AUXPS1 and the fact that the rate of change of the current provided by the first holding inductor L_HLD1 is limited), the first output voltage V_OUT1 may contribute to the first auxiliary power supply signal AUXPS1 for short periods of time. The first offset capacitor C_OFF1, in addition to storing charge that may be required to boost the first auxiliary power supply signal AUXPS1 in times of rapid change or large signal amplitudes as discussed above, also reduces the necessary dynamic range of the first output voltage V_OUT1 from the first parallel amplifier 116A to maintain full control over the first auxiliary power supply signal AUXPS1. This in turn reduces the necessary first parallel amplifier supply voltage PA_SUPP1 and thus improves efficiency.

The first output current I_OUT1 is provided to first auxiliary power converter control circuitry 118A, which provides the first auxiliary control signal AUXC1 to the first auxiliary power converter switching circuitry 104A based thereon. Accordingly, the first parallel amplifier 116A acts primarily as a master device, while the first auxiliary power converter switching circuitry 104A acts as a slave device via the first output current I_OUT1 from the first parallel amplifier 116A. This design choice is due to the fact that the first parallel amplifier 116A is a linear amplifier that is not very efficient at providing signals with the dynamic range of the first auxiliary power supply signal AUXPS1, while the first auxiliary power converter switching circuitry 104A along with the primary power converter switching circuitry 102 and the associated energy storage components are very efficient at doing so. Providing the first auxiliary power supply signal AUXPS1 in this manner thus allows for accurate envelope tracking with good efficiency.

The first envelope control signal(s) ECS1 are provided such that the first auxiliary power supply signal AUXPS1 is envelope modulated at the same or a lower frequency than the second envelope tracking power supply signal EPS2. Generally, the modulation of the first auxiliary power supply signal AUXPS1 will occur within a different voltage range than the second envelope tracking power supply signal EPS2 due to the offset in voltage provided by the second offset capacitor C_OFF2. This may be compensated for in the first envelope control signal(s) ECS1. Further, the bandwidth of the first auxiliary power supply signal AUXPS1 may be limited in order to improve efficiency in some cases. For example, the bandwidth of the first auxiliary power supply signal AUXPS1 may be lower than that of the second envelope tracking power supply signal EPS1, since the first parallel amplifier 116A is supplied from the voltage regulator 108 and thus may suffer from poor efficiency when operated at high bandwidth and/or dynamic range. Any number of different envelope tracking control schemes may be used to provide the first auxiliary power supply signal AUXPS1 to improve the efficiency of the dual-mode envelope tracking/average power tracking power converter circuitry 92, the details of which will be appreciated by those of ordinary skill in the art.

Figure 11:
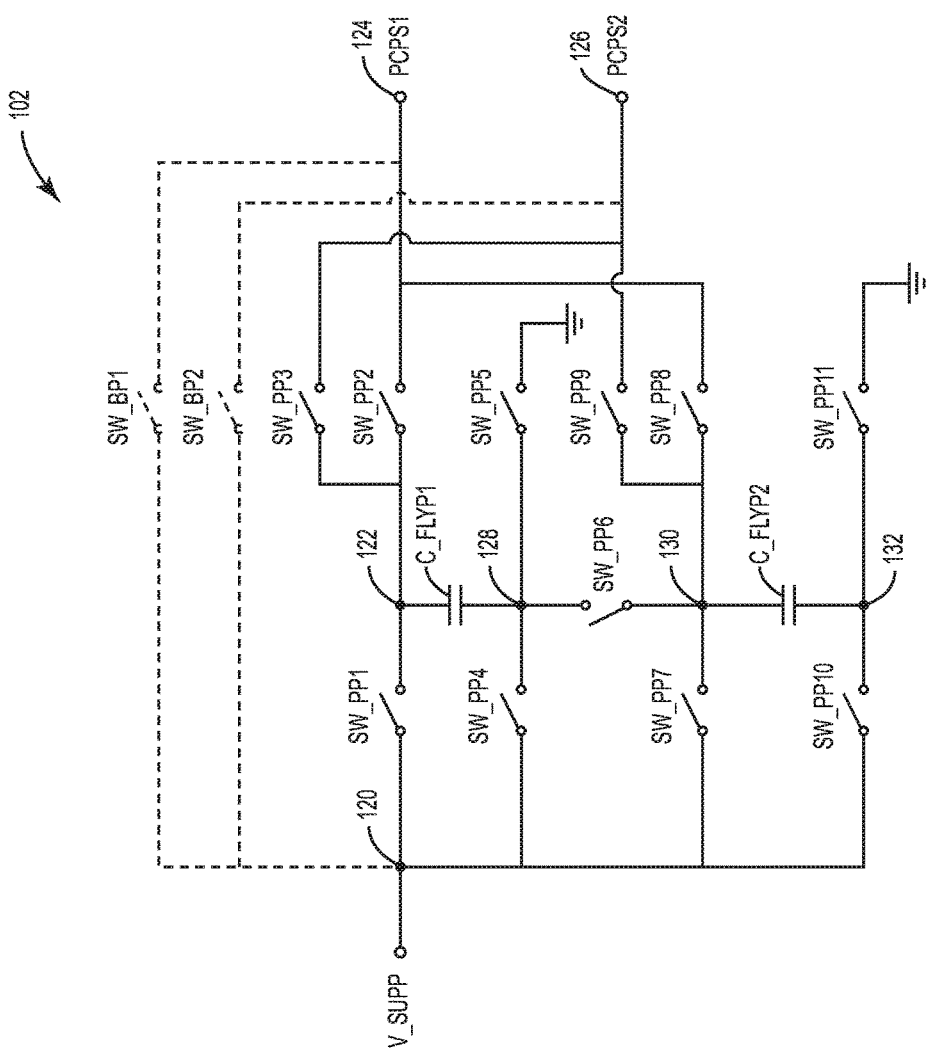
FIG. 11 is a functional schematic illustrating details of primary power converter switching circuitry according to one embodiment of the present disclosure.

FIG. 11 shows details of the primary power converter switching circuitry 102 according to one embodiment of the present disclosure. The primary power converter switching circuitry 102 includes a first primary power converter switching element SW_PP1 coupled between a supply voltage input node 120 and a first intermediate node 122, a second primary power converter switching element SW_PP2 coupled between the first intermediate node 122 and a first output node 124 from which the first primary power converter power supply signal PCPS1 is provided, a third primary power converter switching element SW_PP3 coupled between the first intermediate node 122 and a second output node 126 from which the second primary power converter power supply signal PCPS2 is provided, a fourth primary power converter switching element SW_PP4 coupled between the supply voltage input node 120 and a second intermediate node 128, a fifth primary power converter switching element SW_PP5 coupled between the second intermediate node 128 and ground, a sixth primary power converter switching element SW_PP6 coupled between the second intermediate node 128 and a third intermediate node 130, a seventh primary power converter switching element SW_PP7 coupled between the supply voltage input node 120 and the third intermediate node 130, an eighth primary power converter switching element SW_PP8 coupled between the third intermediate node 130 and the first output node 124, a ninth primary power converter switching element SW_PP9 coupled between the third intermediate node 130 and the second output node 126, a tenth primary power converter switching element SW_PP10 coupled between the supply voltage input node 120 and a fourth intermediate node 132, and an eleventh primary power converter switching element SW_PP11 coupled between the fourth intermediate node 132 and ground. A first primary power converter flying capacitor C_FLYP1 is coupled between the first intermediate node 122 and the second intermediate node 128. A second primary power converter flying capacitor C_FLYP2 is coupled between the third intermediate node 130 and the fourth intermediate node 132. Together, the primary power converter switching elements SW_PP1-SWPP_11, the first primary power converter flying capacitor C_FLYP1, and the second primary power converter flying capacitor C_FLYP2 form a boost converter, the operation of which is discussed below.

In some embodiments, a first bypass switching element SW_BP1 is coupled between the supply voltage input node 120 and the first output node 124 and a second bypass switching element SW_BP2 is coupled between the supply voltage input node 120 and the second output node 126. These bypass switches allow the supply voltage V_SUPP to be provided directly to the first output node 124 and the second output node 126, respectively, which may be desirable in some circumstances.

The primary power converter switching circuitry 102 can be operated to provide 2× the supply voltage V_SUPP or 1.5× the supply voltage V_SUPP to the first output node 124, the second output node 126, or both, depending on the operation thereof. Further, the primary power converter switching circuitry 102 can provide these multiples of the supply voltage asynchronously to each one of the first output node 124 and the second output node 126. To provide 2× the supply voltage V_SUPP at either the first output node 124 or the second output node 126, each one of the first primary power converter flying capacitor C_FLYP1 and the second primary power converter flying capacitor C_FLYP2 are coupled in parallel between the supply voltage input node 120 and ground. For example, the first primary power converter switching element SW_PP1, the fifth primary power converter switching element SW_PP5, the seventh primary power converter switching element SW_PP7, and the eleventh primary power converter switching element SW_PP11 may be closed, while the other primary power converter switching elements are opened. Accordingly, each one of the first primary power converter flying capacitor C_FLYP1 and the second primary power converter flying capacitor C_FLY2 are charged to the supply voltage V_SUPP.

The first primary power converter flying capacitor C_FLYP1 and the second primary power converter flying capacitor C_FLYP2 may then be coupled in parallel between the supply voltage input node 120 and the first output node 124, for example, by closing the second primary power converter switching element SW_PP2, the fourth primary power converter switching element SW_PP4, the eighth primary power converter switching element SW_PP8, and the tenth primary power converter switching element SW_PP10 while opening the remaining primary power converter switching elements. This results in 2× the supply voltage at the first output node 124. To provide the same at the second output node 126, the third primary power converter switching element SW_PP3 may be closed. This may be accomplished as desired such that the multiplied supply voltage can be provided to the second output node 126 asynchronously from the first output node 124.

The same multiplied supply voltage may be provided to the second output node 126 by closing the third primary power converter switching element SW_PP3, the fourth primary power converter switching element SW_PP4, the ninth primary power converter switching element SW_PP9, and the tenth primary power converter switching element SW_PP10. The multiplied supply voltage may then be provided asynchronously to the first output node 124 by closing the eighth primary power converter switching element SW_PP8 as desired.

To provide 1.5× the supply voltage V_SUPP using the primary power converter switching circuitry 102, the first primary power converter flying capacitor C_FLYP1 and the second primary power converter flying capacitor C_FLYP2 may be provided in series between the supply voltage input node 120 and ground. This may be accomplished, for example, by closing the first primary power converter switching element SW_PP1, the sixth primary power converter switching element SW_PP6, and the eleventh primary power converter switching element SW_PP11, while the other primary power converter switching elements remain open. Accordingly, each one of the first primary power converter flying capacitor C_FLYP1 and the second primary power converter flying capacitor C_FLY2 is charged to half of the supply voltage V_SUPP. The first flying capacitor C_FLYP1 and the second flying capacitor C_FLYP2 may then be coupled in parallel between the supply voltage input node 120, the first output node 124, and the second output node 126 as discussed above in order to provide 1.5× the supply voltage V_SUPP asynchronously from the first output node 124 and the second output node 126.

Additional multipliers of the supply voltage V_SUPP may be achieved using different charging and discharging configurations of the primary power converter switching circuitry 102, the details of which will be appreciated by those of ordinary skill in the art. Further, additional primary power converter flying capacitors and/or primary power converter switching elements may be provided to support additional voltage multipliers that may be desired without departing from the principles described herein.

Those skilled in the art will recognize improvements and modifications to the embodiments of the present disclosure. All such improvements and modifications are considered within the scope of the concepts disclosed herein and the claims that follow.

What is claimed is:

1. Envelope tracking power converter circuitry comprising:
- a first envelope tracking power supply signal output node;
- a second envelope tracking power supply signal output node;
- a main switching power converter configured to provide a boost voltage based on a supply voltage;
- a voltage regulator configured to provide a regulated supply voltage based on the supply voltage;
- a first parallel amplifier configured to provide a first output voltage and a first output current based on a first parallel amplifier supply voltage, a first envelope power converter control signal, and a first feedback signal from the first envelope tracking power supply signal output node;
- a second parallel amplifier configured to provide a second output voltage and a second output current based on a second parallel amplifier supply voltage, a second envelope power converter control signal, and a second feedback signal from the second envelope tracking power supply signal output node;
- a first auxiliary switching power converter configured to provide a portion of a first envelope tracking power supply signal to the first envelope tracking power supply signal output node based on the boost voltage and a first auxiliary control signal, wherein the first auxiliary control signal is based on the first output current; and
- a second auxiliary switching power converter configured to:
  - in a first mode of operation, provide a portion of a second envelope tracking power supply signal to the second envelope tracking power supply signal output node based on the boost voltage and a second auxiliary control signal, wherein the second auxiliary control signal is based on the second output current; and
  - in a second mode of operation, provide the first parallel amplifier supply voltage based on the boost voltage and the second auxiliary control signal, wherein the first parallel amplifier supply voltage is envelope modulated.

2. The envelope tracking power converter circuitry of claim 1 wherein:
- the first auxiliary switching power converter is configured to provide the portion of the first envelope tracking power supply signal to the first envelope tracking power supply signal output node in a first mode of operation; and
- in a second mode of operation, the first auxiliary switching power converter is configured to provide the second parallel amplifier supply voltage based on the boost voltage and the first output current such that the second parallel amplifier supply voltage is envelope modulated.

3. The envelope tracking power converter circuitry of claim 2 wherein:
- the first auxiliary switching converter is further configured to, in a third mode of operation, provide a first average power tracking power supply signal to the first envelope tracking power supply signal output node based on the boost voltage and the first auxiliary control signal, wherein the first auxiliary control signal is based on the first output current; and
- the second auxiliary power converter is further configured to, in a third mode of operation, provide a second average power tracking power supply signal to the second envelope tracking power supply signal output node based on the boost voltage and the second auxiliary control signal, wherein the second auxiliary control signal is based on the second output current from the second parallel amplifier.

4. The envelope tracking power converter circuitry of claim 3 wherein:
- in the first mode of operation of the first auxiliary switching power converter, the second parallel amplifier supply voltage is the regulated supply voltage; and
- in the first mode of operation of the second auxiliary switching power converter, the first parallel amplifier supply voltage is the regulated supply voltage.

5. The envelope tracking power converter circuitry of claim 4 wherein the voltage regulator is a low dropout regulator.

6. The envelope tracking power converter circuitry of claim 3 wherein:
- the main switching power converter is a boost converter;
- the first auxiliary switching power converter is a buck converter; and
- the second auxiliary switching power converter is a buck converter.

7. The envelope tracking power converter circuitry of claim 2 wherein:
- in the first mode of operation of the first auxiliary switching power converter, the second parallel amplifier supply voltage is the regulated supply voltage; and
- in the first mode of operation of the second auxiliary switching power converter, the first parallel amplifier supply voltage is the regulated supply voltage.

8. The envelope tracking power converter circuitry of claim 7 wherein the voltage regulator is a low dropout regulator.

9. The envelope tracking power converter circuitry of claim 2 wherein:
- the main switching power converter is a boost converter;
- the first auxiliary switching power converter is a buck converter; and
- the second auxiliary switching power converter is a buck converter.

10. The envelope tracking power converter circuitry of claim 1 wherein:
- in the first mode of operation of the first auxiliary switching power converter, the second parallel amplifier supply voltage is the regulated supply voltage; and
- in the first mode of operation of the second auxiliary switching power converter, the first parallel amplifier supply voltage is the regulated supply voltage.

11. The envelope tracking power converter circuitry of claim 10 wherein the voltage regulator is a low dropout regulator.

12. The envelope tracking power converter circuitry of claim 1 wherein:
- the main switching power converter is a boost converter;
- the first auxiliary switching power converter is a buck converter; and
- the second auxiliary switching power converter is a buck converter.

13. A radio frequency (RF) transmitter section comprising:
- a first set of power amplifiers configured to receive and amplify RF input signals within a first set of operating bands;
- a second set of power amplifiers configured to receive and amplify RF input signals within a second set of operating bands; and
- envelope tracking power converter circuitry comprising:
  - a first envelope tracking power supply signal output node coupled to the first set of power amplifiers;
  - a second envelope tracking power supply signal output node coupled to the second set of power amplifiers;
  - a main switching power converter configured to provide a boost voltage based on a supply voltage;
  - a voltage regulator configured to provide a regulated supply voltage based on the supply voltage;
  - a first parallel amplifier configured to provide a first output voltage and a first output current based on a first parallel amplifier supply voltage, a first envelope power converter control signal, and a first feedback signal from the first envelope tracking power supply signal output node;
  - a second parallel amplifier configured to provide a second output voltage and a second output current based on a second parallel amplifier supply voltage, a second envelope power converter control signal, and a second feedback signal from the second envelope tracking power supply signal output node;
  - a first auxiliary switching power converter configured to provide a portion of a first envelope tracking power supply signal to the first envelope tracking power supply signal output node based on the boost voltage and a first auxiliary control signal, wherein the first auxiliary control signal is based on the first output current; and
  - a second auxiliary switching power converter configured to:
    - in a first mode of operation, provide a portion of a second envelope tracking power supply signal to the second envelope tracking power supply signal output node based on the boost voltage and a second auxiliary control signal, wherein the second auxiliary control signal is based on the second output current; and
    - in a second mode of operation, provide the first parallel amplifier supply voltage based on the boost voltage and the second auxiliary control signal, wherein the first parallel amplifier supply voltage is envelope modulated.

14. The envelope tracking power converter circuitry of claim 13 wherein:
the first auxiliary switching power converter is configured to provide the portion of the first envelope tracking power supply signal to the first envelope tracking power supply signal output node in a first mode of operation; and
in a second mode of operation, the first auxiliary switching power converter is configured to provide the second parallel amplifier supply voltage based on the boost voltage and the first output current such that the second parallel amplifier supply voltage is envelope modulated.

15. The envelope tracking power converter circuitry of claim 14 wherein:
the first auxiliary switching converter is further configured to, in a third mode of operation, provide a first average power tracking power supply signal to the first envelope tracking power supply signal output node based on the boost voltage and the first auxiliary control signal, wherein the first auxiliary control signal is based on the first output current; and
the second auxiliary power converter is further configured to, in a third mode of operation, provide a second average power tracking power supply signal to the second envelope tracking power supply signal output node based on the boost voltage and the second auxiliary control signal, wherein the second auxiliary control signal is based on the second output current from the second parallel amplifier.

16. The envelope tracking power converter circuitry of claim 15 wherein:
in the first mode of operation of the first auxiliary switching power converter, the second parallel amplifier supply voltage is the regulated supply voltage; and
in the first mode of operation of the second auxiliary switching power converter, the first parallel amplifier supply voltage is the regulated supply voltage.

17. The envelope tracking power converter circuitry of claim 16 wherein the voltage regulator is a low dropout regulator.

18. The envelope tracking power converter circuitry of claim 15 wherein:
the main switching power converter is a boost converter;
the first auxiliary switching power converter is a buck converter; and
the second auxiliary switching power converter is a buck converter.

19. The envelope tracking power converter circuitry of claim 13 wherein:
the first set of power amplifiers are configured to amplify the RF input signals within the first set of operating bands based on the first envelope tracking power supply signal; and
the second set of power amplifiers are configured to amplify the RF input signals within the second set of operating bands based on the second envelope tracking power supply signal.

20. The envelope tracking power converter circuitry of claim 13 wherein the first envelope tracking power supply signal and the second envelope tracking power supply signal are provided asynchronously.

* * * * *

UNITED STATES PATENT AND TRADEMARK OFFICE
CERTIFICATE OF CORRECTION

PATENT NO. : 9,912,297 B2  
APPLICATION NO. : 15/195050  
DATED : March 6, 2018  
INVENTOR(S) : Nadim Khlat Page 1 of 1

It is certified that error appears in the above-identified patent and that said Letters Patent is hereby corrected as shown below:

In the Specification

In Column 11, Line 42, replace "antenna 1008" with --antenna 100B--.

In Column 12, Line 29, replace "antenna 1008" with --antenna 100B--.

Signed and Sealed this
Seventeenth Day of April, 2018

Andrei Iancu
*Director of the United States Patent and Trademark Office*